US006939632B2

(12) United States Patent
Arana et al.

(10) Patent No.: US 6,939,632 B2
(45) Date of Patent: Sep. 6, 2005

(54) THERMALLY EFFICIENT MICROMACHINED DEVICE

(75) Inventors: Leonel R. Arana, Cambridge, MA (US); Aleksander J. Franz, Winchester, MA (US); Klavs F. Jensen, Lexington, MA (US); Samuel B. Schaevitz, San Rafael, CA (US); Martin A. Schmidt, Reading, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 465 days.

(21) Appl. No.: 09/923,139

(22) Filed: Aug. 6, 2001

(65) Prior Publication Data

US 2003/0027022 A1 Feb. 6, 2003

(51) Int. Cl.[7] .......................... H01M 8/04; H01M 8/06; F28D 7/00; F28F 1/00; B81B 1/00
(52) U.S. Cl. ............................. 429/17; 429/19; 429/26; 422/198; 165/172; 165/177; 165/181
(58) Field of Search ..................... 429/17, 19, 20, 429/26, 34; 165/177, 181, 182, 172; 422/198, 200, 206

(56) References Cited

U.S. PATENT DOCUMENTS

| 4,386,505 A | 6/1983 | Little |
| 4,516,632 A | 5/1985 | Swift et al. |
| 4,614,119 A | 9/1986 | Zavracky et al. |
| 4,908,112 A | 3/1990 | Pace |
| 5,021,663 A | 6/1991 | Hornbeck |
| 5,094,906 A | 3/1992 | Witzke et al. |

(Continued)

FOREIGN PATENT DOCUMENTS

WO  WO 99/44736  9/1999

OTHER PUBLICATIONS

Lebouitz, K.S., MEMS Microshells for Microneedles, Microscale Fluid Visualization, and Vacuum Packaging of Microdevices (A dissertation submitted in partial satisfaction of the requirements for the degree of Doctor of Philosophy in Engineering—Mechanical Engineering), Chapter 3, pp. 40–55, Fall 1998, University of California, Berkeley (USA).

Wegeng et al., Developing New Miniature Energy Systems, Mechanical Engineering, vol. 116, No. 9, pp 82–85, Sep. 1994.

Mehra et al., Development of a Hydrogen Combustor for a Microfabricated Gas Turbine Engine, presented at Solid–State Sensor and Actuator Workshop, Hilton Head Island, South Carolina, Jun. 8–11, 1998.

*Primary Examiner*—Jonathan Crepeau
(74) *Attorney, Agent, or Firm*—Kirkpatrick & Lockhart Nicholson Graham LLP

(57) ABSTRACT

A micromachined device for efficient thermal processing at least one fluid stream includes at least one fluid conducting tube having at least a region with wall thickness of less than 50 μm. The device optionally includes one or more thermally conductive structures in thermal communication with first and second thermally insulating portions of the fluid conducting tube. The device also may include a thermally conductive region, and at least a portion of the fluid conducting tube is disposed within the region. A plurality of structures may be provided projecting from a wall of the fluid conducting tube into an inner volume of the tube. The structures enhance thermal conduction between a fluid within the tube and a wall of the tube. A method for fabricating, from a substrate, a micromachined device for processing a fluid stream allows the selective removal of portions of the substrate to provide desired structures integrated within the device. As an example, the micromachined device may be adapted to efficiently react fluid reactants to produce fuel for a fuel cell associated with the device, resulting in a system capable of conversion of chemical to electrical energy.

63 Claims, 27 Drawing Sheets

U.S. PATENT DOCUMENTS

| | | |
|---|---|---|
| 5,209,906 A | 5/1993 | Watkins et al. |
| 5,385,709 A | 1/1995 | Wise et al. |
| 5,428,961 A | 7/1995 | Sakakibara et al. |
| 5,458,191 A | 10/1995 | Chiang et al. |
| 5,534,328 A | 7/1996 | Ashmead et al. |
| 5,589,136 A | 12/1996 | Northrup et al. |
| 5,595,712 A | 1/1997 | Harbster et al. |
| 5,639,423 A | 6/1997 | Northrup et al. |
| 5,646,039 A | 7/1997 | Northrup et al. |
| 5,674,742 A | 10/1997 | Northrup et al. |
| 5,789,753 A | 8/1998 | Gooch et al. |
| 5,811,062 A | 9/1998 | Wegeng et al. |
| 5,843,385 A | 12/1998 | Dugan |
| 5,863,502 A | 1/1999 | Southgate et al. |
| 5,882,496 A | 3/1999 | Northrup et al. |
| 5,932,315 A | 8/1999 | Lum et al. |
| 5,941,079 A | 8/1999 | Bowman et al. |
| 5,961,930 A | 10/1999 | Chatterjee et al. |
| 5,961,932 A | 10/1999 | Ghosh et al. |
| 5,965,092 A | 10/1999 | Chatterjee et al. |
| 5,965,237 A | 10/1999 | Bruin et al. |
| 6,062,210 A | 5/2000 | Welles |
| 6,170,568 B1 | 1/2001 | Valenzuala |
| 6,180,536 B1 | 1/2001 | Chong et al. |
| 6,192,596 B1 | 2/2001 | Bennett et al. |
| 6,193,501 B1 | 2/2001 | Masel et al. |
| 6,194,066 B1 | 2/2001 | Hoffman |
| 6,200,536 B1 | 3/2001 | Tonkovich et al. |
| 6,210,986 B1 | 4/2001 | Arnold et al. |
| 6,250,379 B1 | 6/2001 | Geissler et al. |
| 6,477,901 B1 * | 11/2002 | Tadigadapa et al. ... 73/861.352 |

* cited by examiner

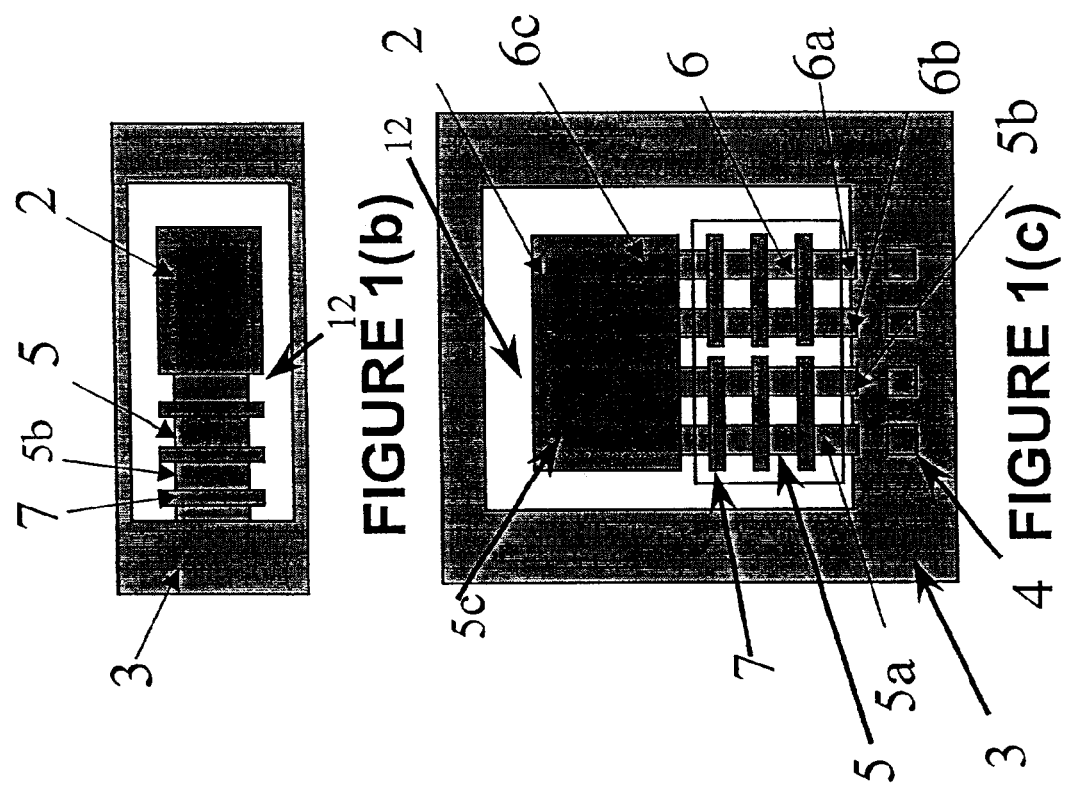

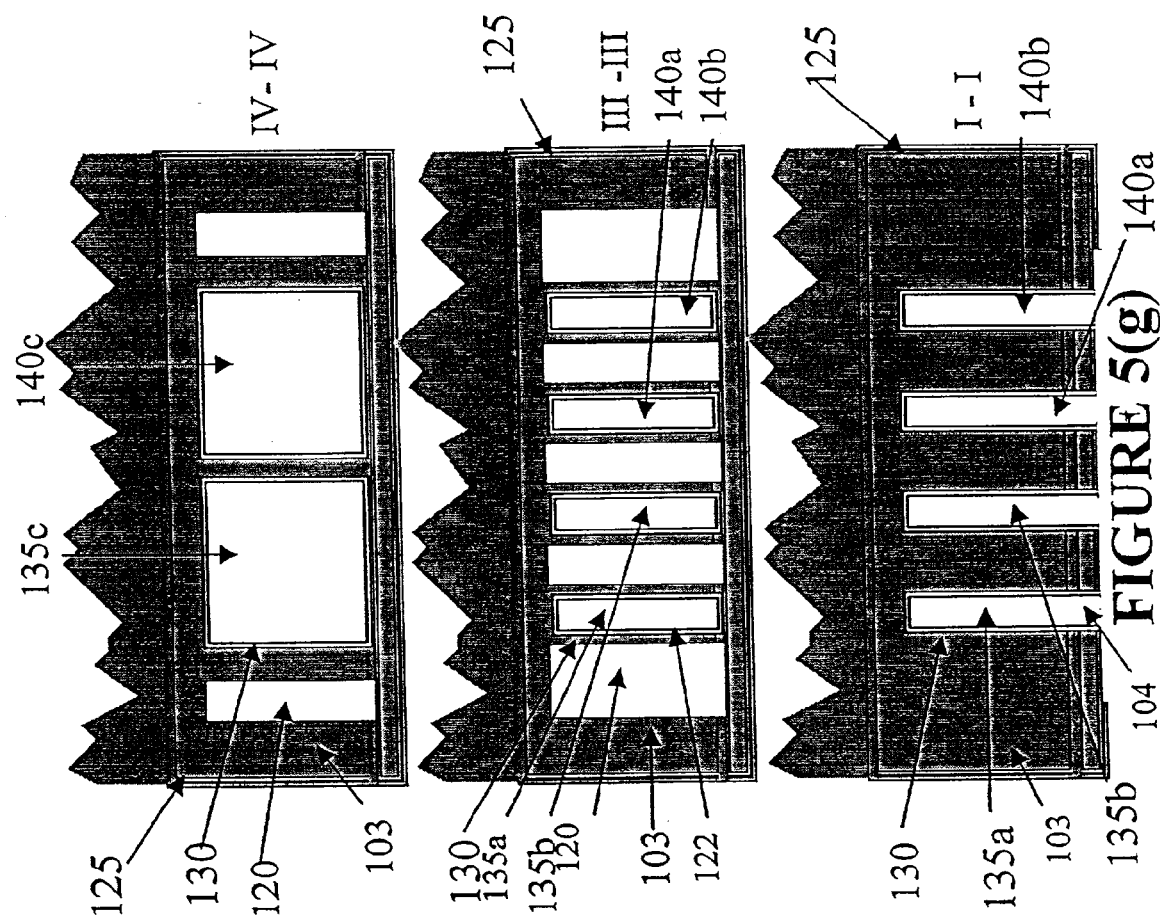

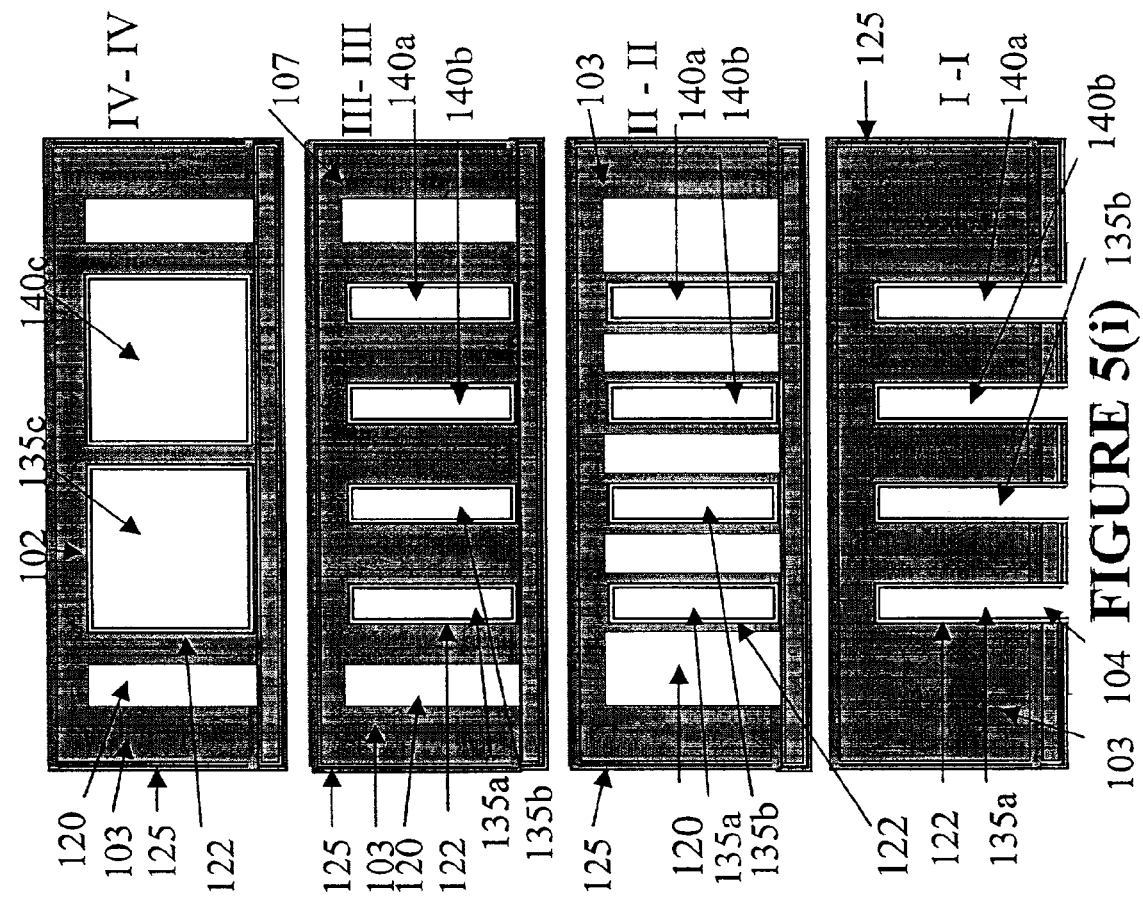

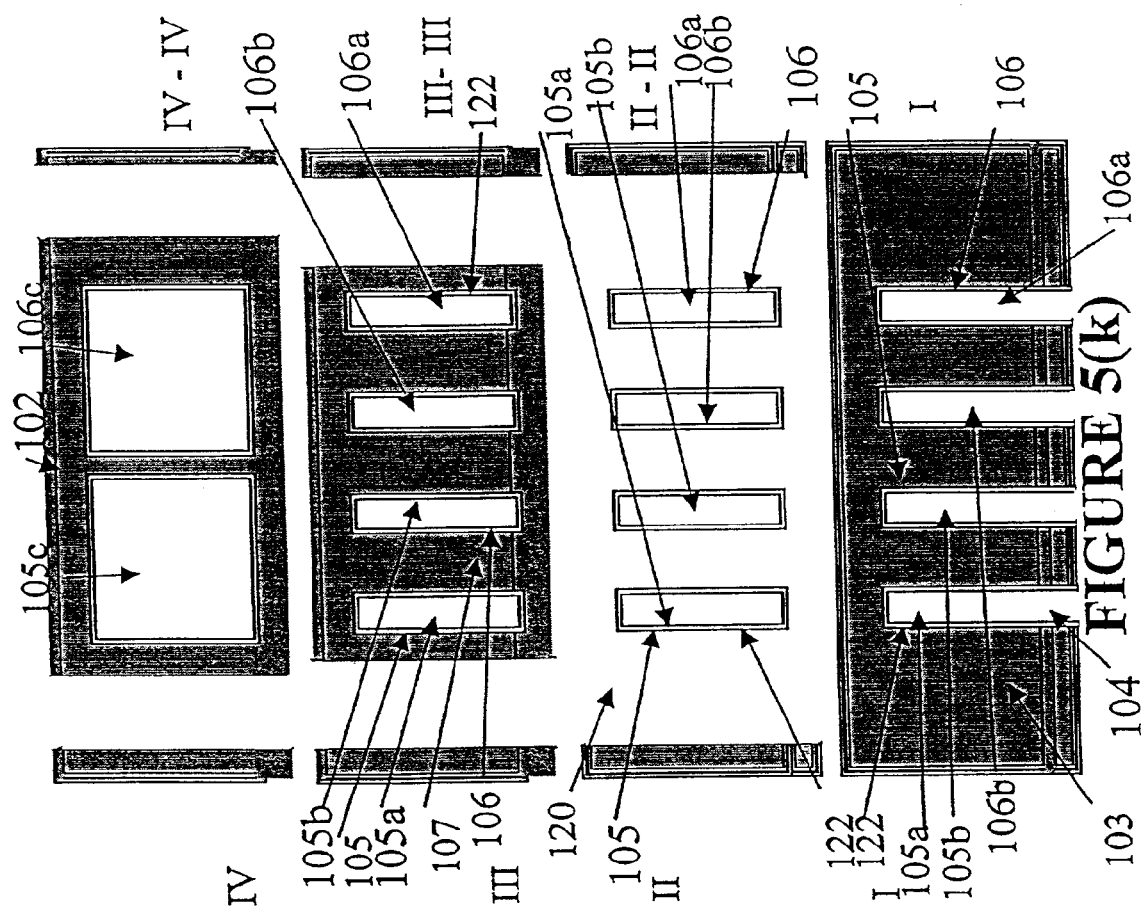

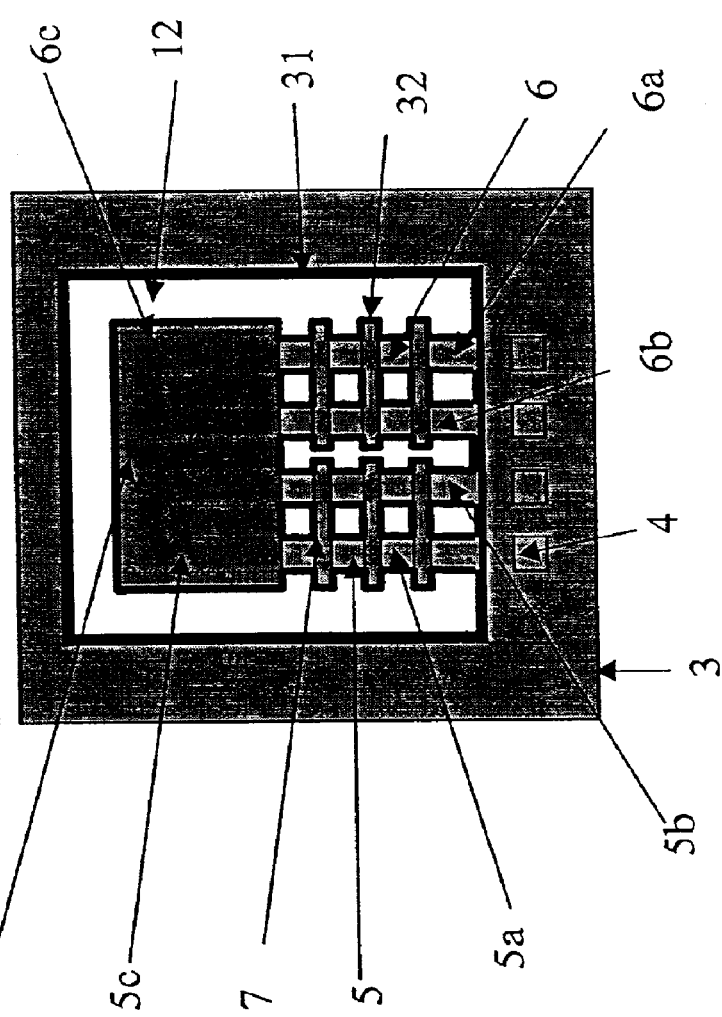
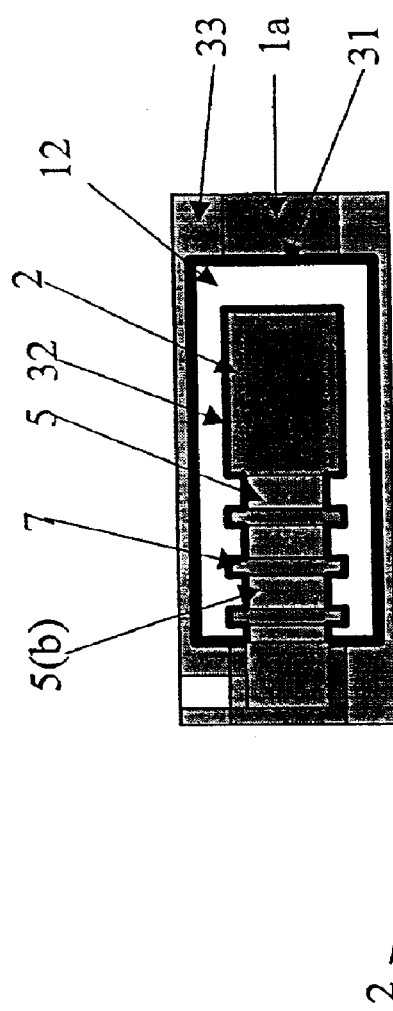
FIGURE 6(a)
FIGURE 6(b)

THERMALLY EFFICIENT MICROMACHINED DEVICE

STATEMENT REGARDING FEDERALLY SPONSORED RESEARCH OR DEVELOPMENT

Work related to the present invention was supported in part under DARPA Contract No. F30602-99-2-0544. The government may have certain rights in the invention.

CROSS REFERENCE TO RELATED APPLICATIONS

Not applicable.

TECHNICAL FIELD AND INDUSTRIAL APPLICABILITY OF THE INVENTION

The present invention is generally directed to a micromachined device for efficient thermal processing of fluids. More particularly, the present invention is directed to a micromachined device for carrying out fluid processing with improved thermal efficiency. As used herein, fluid processing includes, for example, subjecting a stream of a fluid to chemical reactions, heating, cooling, filtration, adsorption, desorption, and/or phase changes (e.g., evaporation and condensation). The present invention may be used in, for example, the processing of chemicals for purposes of power generation.

DESCRIPTION OF THE INVENTION BACKGROUND

The field of micromachined fluidic devices encompasses all systems that process components (e.g., gases, liquids, solid particles (e.g., beads), complex molecules (e.g., DNA), and mixtures thereof) and contain small features (minimum feature sizes smaller than 500 $\mu$m ). Such micromachined devices have been shown to be useful in many fields, including chemical and biological analyses (e.g., capillary electrophoretic separations), small-scale chemical synthesis, and measurement of reaction kinetics. The smaller dimensions inherent in micromachined devices enable significantly smaller fluid flow rates, reduced system size, and, in many cases, improved performance.

A variety of fluid-processing micromachined devices are disclosed in the prior art. For example, U.S. Pat. No. 6,192,596 provides an active microchannel fluid processing unit and a method of making the unit. Arrays of parallel microchannels separated by thermally conductive fins provide the mechanism for heat transfer to or from fluids moving through the microchannels.

U.S. Pat. No. 6,193,501 discloses a microcombustor of sub-millimeter dimensions. A preferred embodiment includes a wafer stack of at least three wafers, with the central wafer housing a combustion chamber. At least one inlet and one outlet are included for the insertion of reactants and the exhaust of a flame.

U.S. Pat. No. 4,516,632 discloses a microchannel cross-flow fluid heat exchanger and a method for making the same. The heat exchanger is formed from a stack of thin metal sheets bonded together.

One possible application of fluid-processing micromachined devices is as portable electric generators. This application is promising because the energy density of chemical fuels exceeds that of presently available batteries by approximately two orders of magnitude. However, to take advantage of the high energy density of chemical fuels and compete with batteries for portable power applications, suitable efficient designs for micro-sized fuel processors/generators that convert chemical to electrical energy must be created. Fuel processors/generators usually require regions of high temperature in order to sustain the desired reaction. The power consumed in sustaining those temperatures reduces the overall efficiency of the system. As device dimensions become smaller, it becomes increasingly difficult to maintain the thermal gradients and thermal insulation required for efficient fuel processing. Often with existing micromachined fuel processing devices, significantly more power is required to maintain the temperature within the high temperature regions of the device than is contained in the fuel, precluding the device's use for portable power generation.

Thermal management is crucial to producing efficient devices designed to operate with separate features held at different temperatures. In particular, thermal isolation of the reaction zone in micromachined power generation systems is paramount. For micromachined non-fluidic devices, thermal management is achieved by simple thermal insulation using long, thin and/or non-conductive supports, often assisted by packaging in vacuum. Examples of non-fluidic micromachined devices providing thermal management include, for example, bolometers, such as those disclosed in U.S. Pat. Nos. 5,021,663 and 5,789,753. However, the present inventors have concluded that micromachined fluidic devices add three unique difficulties: the need for enclosed fluidic structures connecting the thermal regions; the potential of added heat flow through thermal convection; and, frequently, a desire to include regions where the walls of the fluid conducting tube are held isothermal. Thus, a successful thermal management scheme for a micromachined fluidic device must include, in addition to certain known inventions and techniques used in non-fluidic thermal devices, a means to provide fluid communication with high temperature regions without causing excessive heat flow either through the static structure or through the moving fluid. It is frequently desirable to include in this scheme means to ensure thermal uniformity in specific regions of the device.

Accordingly, it would be advantageous to provide a micromachined device capable of efficiently conducting a chemical process involving at least one fluid, wherein a high temperature reaction zone is thermally isolated from its environment. It also would be advantageous to provide a micromachined device for conducting a chemical reaction involving fluidic reactants and wherein operation of the device consumes substantially less energy than can be produced from the fluid reactants. Such a device could be used as part of a portable electric generator.

SUMMARY OF THE INVENTION

The present invention addresses the above-described needs by providing a micromachined device for thermal processing at least one fluid stream. The micromachined device includes at least one fluid conducting tube, and at least a region of the fluid conducting tube has a wall thickness of less than 50 $\mu$m.

The present invention further addresses the above-described needs by providing a micromachined device for processing at least one fluid stream, and wherein the device incorporates at least one fluid conducting tube and at least one thermally conductive structure. The thermally conductive structure is in thermal communication with a first thermally insulating portion of the fluid conducting tube and a second thermally insulating portion of the fluid conducting tube.

The present invention also addresses the above-described needs by providing a micromachined device for processing at least two fluid streams including a first fluid conducting tube, a second fluid conducting tube, and at least one thermally conductive structure. The thermally conductive structure is in thermal communication with a thermally insulating portion of the first fluid conducting tube and a thermally insulating portion of the second fluid conducting tube.

The present invention additionally offers a solution to the above-described needs by providing a micromachined device for processing at least one fluid stream, wherein the device includes a thermally conductive region and at least one fluid conducting tube having at least one thermally insulating portion. At least a portion of the fluid conducting tube is disposed within the thermally conductive region.

The present invention is further directed to a method for processing a fluid stream. The method includes providing a micromachined device having at least one fluid conducting tube having a thermally insulating inlet portion and a thermally insulating outlet portion, and at least one thermally conductive structure in thermal communication with the inlet and outlet portions. A stream of at least one fluid is introduced into the inlet portion of the fluid conducting tube, and the fluid stream is processed within the fluid conducting tube. The thermally conductive structure conducts thermal energy between the inlet and outlets portions of the tube.

The present invention also provides a portable power generator including a micromachined device constructed according to the present invention. The micromachined device includes at least one fluid conducting tube and at least one thermally conductive structure. The thermally conductive structure is in thermal communication with a first thermally insulating portion of a fluid conducting tube and a second thermally insulating portion of a fluid conducting tube. A fuel cell is in fluid communication with the fluid conducting tube. A fuel is produced in the fluid conducting tube and is conveyed to the fuel cell, where it is used to generate power.

The present invention also discloses a method for fabricating a device for processing at least one fluid stream. The method includes patterning a substrate to form at least one tube mold having walls accessible to an environment and to form at least one release pit not accessible to the environment, depositing a thin film to coat the walls of the tube mold but not the release pits, and removing selected regions of the substrate using a chemical etchant to form at least one fluid conducting tube.

Embodiments of the micromachined device of the present invention address the difficulties described above encountered in adapting such devices for use in portable power generation. Micromachined devices constructed according to the present invention may be adapted for conducting chemical reactions with fluidic reactants wherein the device consumes substantially less energy than can be produced from the fluid products. These and other advantages of the present invention will be apparent on consideration of the following detailed description of embodiments of the invention. The reader also may comprehend additional details and advantages of the present invention upon making and/or using the micromachined device of the present invention.

BRIEF DESCRIPTION OF THE DRAWINGS

FIG. 1(b) is a side view of the embodiment of FIG. 1(a). FIG. 1(c) is a top view of the embodiment of FIG. 1(a).

FIGS. 5(a) through 5(k) illustrate a fabrication process for forming a micromachined device constructed according to the present invention.

FIG. 6(a) depicts a top view of an embodiment of the present invention employing the use of vacuum packaging, reflective coating and low-emissivity coating. FIG. 6(b) is a side view of the embodiment of FIG. 13(a) further showing the use of packaging layers.

DETAILED DESCRIPTION OF EMBODIMENTS OF THE INVENTION

Figure 1A:
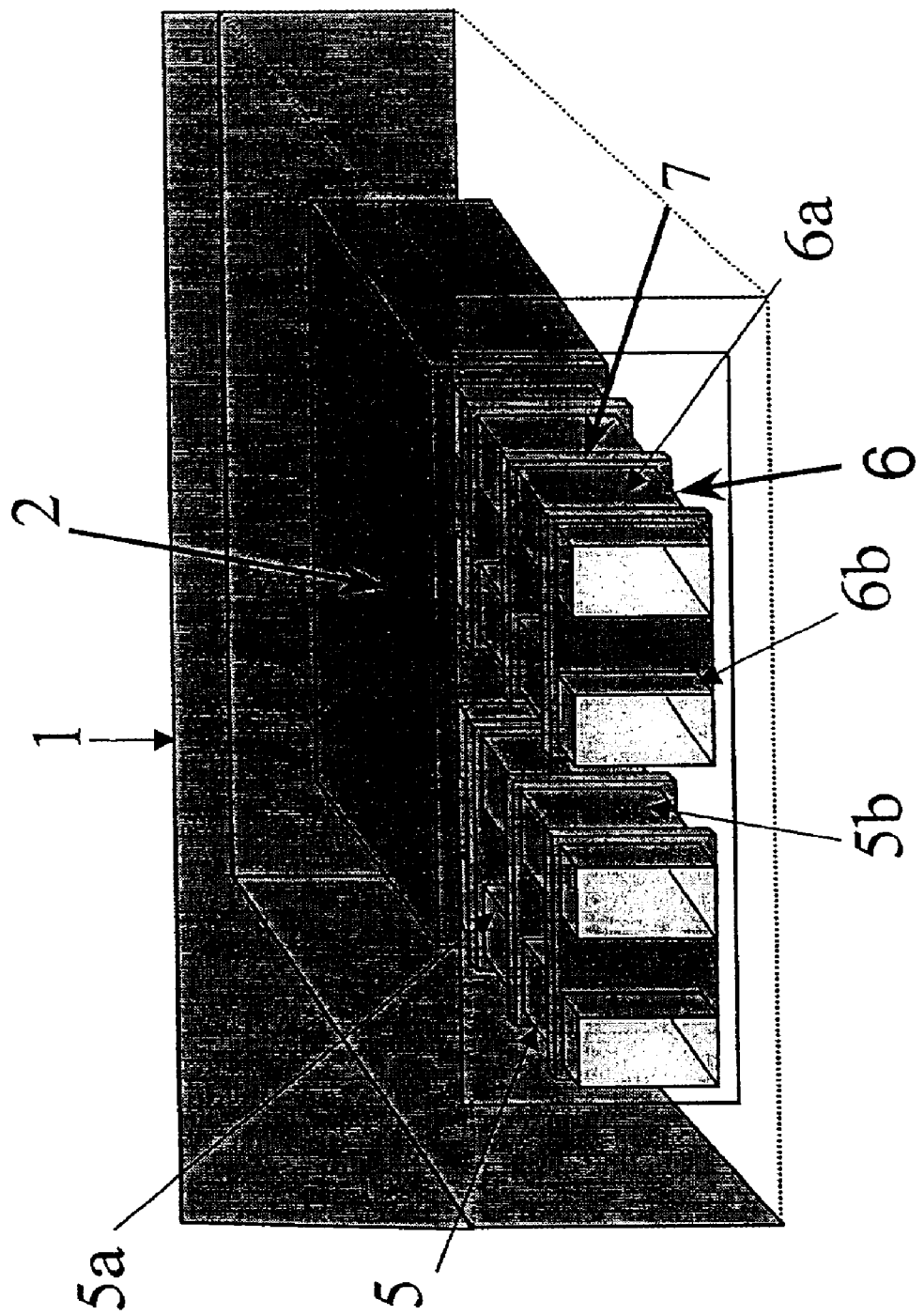
FIG. 1(a) is a schematic representation of an embodiment of a micromachined device adapted for processing a fluid and constructed according to the present invention.

The present invention provides a solution to the problem of maintaining the thermal gradients and thermal insulation required for efficient fluid processing in micromachined devices. It is believed that the present inventors' solution to thermal management of micromachined fluidic systems is an enabling technology for man-portable fuel processing and power generation devices. The application of the present invention to the fuel processing and power generation field could lead to development of micromachined portable power supplies providing energy densities up to at least one order of magnitude greater than state of the art batteries.

It is believed that the application of the present invention to the field of man-portable electric generators should provide substantial advantages. An order of magnitude improvement in the power supply energy density for man-portable electric generators would have a significant impact on the multi-billion dollar battery industry. It would also offer the potential to create an entirely new market for technologies and applications currently made impractical by the low energy density of batteries. In addition to the power field, the present invention has potential utility in a wide range of otherwise unrelated fields, including, for example, small-scale chemical synthesis, chemical sensing and analysis, micro-refrigeration (e.g., for electronics or superconductors), microcalorimetry, thermophotovoltaic power generation, stirling cycles, catalyst testing, and a wide range of chemical and biological laboratory applications, including biological assays, chemical and biological sensing, and high throughput screening.

As used herein, the word "fluid" refers to one or more gases, liquids, solid particles (e.g., beads), complex molecules (e.g., DNA), and combinations thereof.

As used herein, a "micromachined device" has the meaning generally understood in the art, and refers to devices including a structure having a minimum dimension of less than 500 $\mu$m.

As used herein, the word "post" means a hollow or solid elongated structure having a cross-section of any geometry. By way of example only, and without intending to limit the present invention, the cross-section of a post may have a perimeter that is any closed shape, such as circular, oval, square, or rectangular shapes.

As used herein, the term "substantially isothermal" means that the variation in temperature over the substantially isothermal region is less than one fifth of the variation in temperature over the entire device. Temperature variations within the device can be measured in a variety of ways apparent to those skilled in the art. One such approach would involve thermal infrared (IR) imaging of the device. Another such approach would involve placing temperature sensors at varying locations of the device.

As used herein, the terms "thermally insulating" and "thermally conducting" define a relative difference in thermal conductance within a given embodiment of the invention. Specifically, a thermally insulating structure is at least twice, and preferably 10 times less conductance than a thermally conductive structure, as defined by the power required to sustain a given temperature difference across the structure. The conductance may be determined, for example, by direct measurement or, where suitable, by modeling. By way of example, and in not intending to limit the present invention in any way, "thermally insulating" tubes may be obtained by providing tubes with thin walls, preferably less than 50 $\mu$m in thickness.

As used herein, the word "tube" means a hollow structure having an inner perimeter and an outer perimeter, and a cross-section of any geometry, and which allows passage of a fluid therethrough. By way of example only, and without intending to limit the present invention, the cross-section of a tube may have a perimeter that is any closed shape, such as circular, oval, square, or rectangular shape.

One embodiment of the present invention provides a single, thin-walled tube, which may be utilized, for example, in high-temperature fluid processing. The inventors have discovered that tubes with thin walls, preferably less than 50 $\mu$m and more preferably less than 5 $\mu$m in thickness, are useful for such an application because the thin walls provide reduced thermal conduction down the longitudinal axis of tube, even if the tubes span regions of substantially different temperature. To further reduce thermal conduction, the tubes also are preferably made of a thermally insulating material.

Tubes having such thin walls can be fabricated by many techniques known in the field. A preferred technique described in detail below involves fabricating a relatively solid mold with encased tubes, followed by thin-film deposition of the tube material, and then release of the tubes by etching the surrounding mold. This technique provides freestanding tubes with a wall thickness defined by the deposition thickness.

In one embodiment of a micromachined device of the present invention, at least one thermally conductive structure is in thermal communication with a first thermally insulating portion of a fluid conducting tube and a second thermally insulating portion of the same fluid conducting tube. The two portions with which the thermally conducting structure is in communication are at different temperatures, with thermal energy being transferred from the hotter portion to the cooler portion.

Conservation of mass requires that a device in steady-state operation have exactly as much mass flowing into a region as out of the region. Consequently, the heat loss due to gas leaving a region can be minimized by transferring that heat to the incoming fluid stream. An alternate embodiment of the present invention accomplishes that heat exchange by placing thermally conductive structures between a thermally insulating inlet portion of a fluid conducting tube and a thermally insulating outlet portion of a fluid conducting tube. Preferably, the tube is arranged in a U-shape with longitudinal axes of the inlet and outlet portion oriented substantially parallel. Heat flow from the tube due to convection is ameliorated by the conduction of heat from the outlet portion, through which the high temperature reaction products flow, to the inlet portion of the fluid conducting tube. Ideally, thermally conductive structures are substantially isothermal during operation of the device and have minimum dimensions typically larger than those of the tube wall, and are constructed of a relatively highly conductive material in order to facilitate heat flow. Preferably, the thermally conductive structures are comprised of silicon.

Another embodiment of the present invention provides a fluid conducting tube with at least one thermally conductive structure that is in thermal communication with a thermally insulating inlet portion and a thermally insulating outlet portion of the fluid conducting tube. These thermally conductive structures further reduce convective losses, and thus allow for fluid processing to be carried out at higher temperatures and/or lower flow rates. As an example, the thermally conductive structures may be oriented substantially orthogonal to a longitudinal axis of a fluid conducting tube so as not to increase thermal conduction down the length of the tube, while allowing thermal conduction between the inlet and outlet portions. It will be understood that the direction of fluid flow is substantially in the direction parallel to the longitudinal axis of the particular region of the fluid conducting tube. Multiple thermally conductive structures spaced apart along the inlet and outlet portions of the fluid conducting tube may be used to enhance heat exchange over any desired length of the tube.

In one embodiment of the present invention, posts may be included within the fluid conducting tube. The benefits provided by inclusion of the posts are detailed herein below.

An alternate embodiment of the present invention provides a substantially isothermal thermally conductive region in which at least a portion of the fluid conducting tube is disposed. At least a region of the fluid conducting tube is thermally insulating. By way of example only, and without intending to limit the present invention, the portion of the fluid conducting tube may be wholly or partially embedded or encased in the thermally conductive region. The thermal uniformity of the thermally conductive region helps to ensure uniformity of a reaction taking place in the embedded or encased portion of the thin-walled tube, and thus improves selectivity of reaction products and/or improves conversion. The thermally uniform region also may minimize material constraints by eliminating hot spots, maximize emission of radiation for thermophotovoltaic (TPV) applications, and/or maximize contact area available for thermoelectric (TE) generation. Thermal uniformity is also highly desirable in analytical applications where it is critical that certain physical properties are measured at a known and uniform temperature. It is to be understood that while the walls of the fluid conducting tube within the thermally conductive region are substantially isothermal during fluid processing, the fluids contained within the tube are not necessarily substantially isothermal.

The present invention also recognizes that the fluid within the fluid conducting tube may be a poor thermal conductor, causing thermal gradients from the wall of the tube to the region of the fluid at the center of the tube. This non-uniformity can be reduced by including structures within the fluid conducting tube designed to decrease the average distance heat must be conducted through the fluid to reach the tube wall. By way of example, and not intending to limit the present invention in any way, an array of posts may be positioned within the tube, projecting from the tube's inner wall and into the tube's interior volume. The posts preferably are thermally conductive and preferably greater in diameter than the fluid conducting tube wall thickness and preferably are made from a relatively highly conductive material relative to tube wall material. The posts also may be used in conjunction with the above-described thermally conductive structures situated between tube inlet and tube outlet portions to further enhance heat exchange and/or recuperation between the outlet portion of the fluid conducting tube, which contains a fluid at high temperature, and the inlet portion of the tube, containing a fluid at relatively low temperature. The posts may also be used in conjunction with substantially isothermal structures to improve the thermal uniformity of the fluid contained within the substantially isothermal structure.

In another embodiment of a micromachined device of the present invention, at least one thermally conductive structure is in thermal communication with a thermally insulating portion of a first fluid conducting tube and a thermally insulating portion of a second fluid conducting tube. The two portions with which the thermally conducting structure is in communication are at different temperatures, with thermal energy being transferred from the hotter portion to the cooler portion.

Without intending to limit the scope of the present invention, one embodiment combines multiple tubes with a common substantially isothermal thermally conductive region and/or thermally conductive structures. This combination provides an additional improvement that could, for example, allow the heat generated by one reaction to be used by some other endothermic reaction or reactions. For example, hydrogen may be combusted in the presence of air to produce water. This reaction generates thermal energy, which may then be used, for example, to aid in the decomposition of ammonia into hydrogen and nitrogen.

In embodiments of the present invention, the open ends of the tubes may be encased in a common substrate for ease of connecting the invention to the environment.

In embodiments of a micromachined device of the present invention, the encasing of the tube ends may be extended to produce a sealed chamber around portions of the micromachined device. A sealed chamber would be useful in controlling the ambient environment around the structure. For example, the chamber may be evacuated to reduce the conductive and convective losses from the external surfaces of the micromachined device. Alternatively or additionally, the chamber may be filled with an aerogel to reduce the conductive, convective and/or radiative losses. Additionally, coating the interior surfaces of the chamber with a reflective material and/or coating the exterior surfaces of the micromachined device with a non-emitting material would reduce the radiative losses.

Embodiments of a micromachined device of the present invention may be constructed such that high temperature portions of the device are used for direct electrical energy conversion. This may be accomplished, for example, by using thermoelectric (TE) or thermophotovoltaic (TPV) methods.

It is contemplated that in certain embodiments of the present invention the fluid conducting tube may have more than one inlet portion and/or more than one outlet portion. Such tubes may be fabricated as generally described herein with modifications appropriate to form the multiple inlet and/or outlet portions.

In certain embodiments of the present invention the fluid conducting tube can branch into more than one tube. In addition, one tube can be formed from a junction of at least two tubes.

By way of example, and without intending to limit the present invention, any combination of two or more of the following is contemplated: thin-walled tubes, thermally insulating tubes, posts, thermally conductive structures, substantially isothermal regions, thermally conductive posts, multiple tubes, multiple inlets and outlets, branching of one tube into more than one tube, joining multiple tubes into one tube, encasement of the tube ends, packaging of the embodiment in a sealed chamber with various characteristics, and/or inclusion of direct energy conversion devices. The present inventors also contemplate the combination of these elements with other elements, devices, and features known to be useful in fluidic devices. These include thermopiles useful, for example, in power generation, refrigeration, or temperature sensing. A selective or blackbody emitter, used to generate light from heat, may be integrated into devices of the present invention for use in a thermophotovoltaic generator. Various sensors may be integrated into the micromachined device, including resistive temperature sensors, photo-acoustic spectroscopy devices, IR spectroscopy devices, capacitance sensors, thermal conductance sensors, flow sensors, chemical sensors, and any of various other sensors. Actuators may also be integrated into the micromachined device such as, for example, resistive heaters, electrodes for electrophoretic or electroosmotic flow, electrodes for electrochemistry, valves, pumps, and any of various other actuators.

One embodiment of a micromachined device constructed according to the present invention includes at least one fluid conducting tube having a thermally insulating inlet portion which carries fluid to an intermediate portion of the fluid conducting tube located in a thermally conductive region. The fluid conducting tube also has a thermally insulating outlet portion which carries fluid away from the intermediate portion of the fluid conducting tube. Thermally conductive structures contact both the inlet portion and outlet portion. Thus, the direction of fluid flow and the direction of conductive heat flow are separately controlled. That is to say, the direction of fluid flow is in the direction of the tube and conductive heat flow is at least partially through the thermally conductive structures. This substantial separation of fluid flow and conductive heat flow is enabled by the large difference in thermal conductance of the thermally insulating tube portions and the thermally conductive structures, as defined previously. This difference in thermal conductance is achieved by using very thin wall dimensions (below 50 $\mu$m) for the tube and larger dimensions for the thermally conductive structures. Preferably, additional thermal conductance difference is achieved by the use of different materials for the thermally insulating tube portions and thermally conductive structures, with the material used for the thermally conductive structure having a higher thermal conductivity than the material used for the thermally insulating tube portions. The device can be packaged such that the inlet, outlet and intermediate portions are in a vacuum environment, using microfabrication techniques known to those of ordinary skill in the art. The device may also be packaged with IR reflectors lining the vacuum cavity and low emissivity coating on the device itself to minimize radiative heat losses. By way of example only, and without intending to limit the present invention in any way, a silicon substrate may be coated with an IR-reflective material such as aluminum.

In an embodiment of a micromachined device for fluid processing constructed according to the present invention, cold fluid reactants are introduced through a substrate at room temperature to a thermally insulating inlet portion of a fluid conducting tube. The fluid is then transported to an intermediate portion of the fluid conducting tube which is encased in a thermally conductive region. A reaction occurs in the intermediate portion of the fluid conducting tube. Importantly, however, the fluid may react while in the intermediate portion and/or any other portion of the fluid conducting tube. Following the reaction, the fluid products are transported to a thermally insulating outlet portion of the fluid conducting tube. By providing one or more of the thermally conductive structures between and in contact with the inlet and outlet portions, heat is transferred from the fluid products in the outlet portion of the fluid conducting tube to the fluid reactants in the inlet portion of the fluid conducting tube. Only a minimal amount of heat is lost by way of thermal convection through the fluid conducting tube to the substrate.

One type of structure providing good thermal isolation from the environment is a suspended fluid conducting tube made of a thin film ceramic insulator (silicon nitride) attached to a supporting silicon frame. The fluid conducting tube is integrated with slabs of silicon for purposes of thermal management. The silicon slabs are shaped and located to form thermally conductive and/or substantially isothermal structures to enable maintenance of a local thermally uniform region and heat exchange between various process streams, allowing heat recovery between the inlet and outlet portions of the fluid conducting tubes. The fluid conducting tubes may be further insulated using aerogels or can be vacuum packaged. The fluid conducting tubes are usually packaged within a sealed cavity in the substrate. The cavity can be filled with an aerogel to reduce thermal conductivity and minimize emission losses or it can be evacuated to minimize convective/conductive losses. The IR reflectors and/or low emissivity coatings described above may be utilized either alone or in conjunction with the vacuum and/or aerogels.

In one embodiment of the present invention, two U-shaped silicon nitride tubes may be placed in proximity to one another to form four channels. The general U-shape of the tube plays an important role in that it serves to minimize stresses in the tube which may occur as a result of thermal expansion. By minimizing stresses, such untoward results as tube buckling are avoided. Accordingly, while only a U-shaped embodiment is discussed herein, the present invention is not limited to a tube having a U-shape, but rather it is contemplated that any stress-relieving shape may be used. Under suitable conditions it is possible that other tube shapes also may be used. The U-end (intermediate portion) of each tube is completely encased in a single relatively thick layer of silicon (at least 30 $\mu$m). This silicon enables heat exchange between the intermediate portions of the two tubes. Such heat exchange is desirable for carrying out endothermic reactions using a chemical heat source from an exothermic reaction, rather than other forms of heating. One example would be for hydrogen combustion to be carried out primarily in the intermediate portion of one tube to provide the heat required for maintaining temperature of the reaction zones and heat for endothermic hydrogen generation reactions carried out primarily in the intermediate portion of the other tube, such that net hydrogen is produced. The thermal conductance properties of the silicon structure should provide a substantially common temperature throughout the silicon layer. As such, the region of silicon or other thermally conductive material within which the intermediate portion is encased may be referred to as a "substantially isothermal thermally conductive region." Without intending any difference in meaning, the region usually is referred to herein as a "thermally conductive region." By way of example only, and without intending to limit the present invention in any way, the aforementioned "other thermally conductive material" may include any metal, such as copper. The inventors believe that providing such a region would provide a substantial advantage in heat integration of multiple process streams in micromachined devices.

Between the thermally conductive region and the substrate, one or more thermally conductive silicon structures may be provided to span the fluid conducting tubes. The thermally conductive structures provide a thermal link for heat recuperation between the hot fluids leaving the thermally conductive region through an outlet portion of a silicon nitride tube and the cold fluids entering the thermally conductive region through an inlet portion of the silicon nitride tube. A platinum heater/temperature sensing resistor (TSR) with four leads suspended above the tubes meanders over the thermally conductive region. As will be understood by those of ordinary skill in the art, the heater/TSR is essentially a resistive heater. By measuring the voltage drop and current across this resistor and knowing resistance at a reference temperature, the temperature of the heater can be determined. Accordingly, the heater and the sensor may be a single device having multiple functionality or they can be separate devices. Multiple heaters and temperature sensors may also be included at various locations on the device. The materials used for construction of the heater/TSR are known to those of ordinary skill in the art. Alternatively, heating may also be done radiatively or using thermoelectrics. There is no direct silicon pathway between the thermally conductive region and the surrounding silicon chip (substrate).

The present invention also provides a portable power generator including a micromachined device for processing a fluid stream. The generator may be comprised of a micromachined device, such as is described in Examples 3–5 below, wherein the device is in communication with a fuel cell. A preferred product produced by the micromachined device is hydrogen, which may be used as a fuel in many known fuel cells. Alternatively, hydrogen and carbon monoxide may be produced by the micromachined device and used in certain fuel cells.

Another embodiment of the present invention is a refrigeration device, such that the thermally isolated structures are at temperatures lower than the environment. By way of example only, a Peltier cooling device connects the thermally isolated tube region to the substrate. Applying voltage to the Peltier device causes heat to flow from the thermally isolated tube region to the substrate, effectively lowering the temperature of the thermally isolated tube region relative to the substrate and the environment. In one embodiment, thermally conducting structures connect the thermally insulating inlet and outlet portions of the fluid conducting tube. The thermally conducting structures serve to cool the incoming fluid stream and heat up the exiting stream, improving thermal efficiency. The thermally isolating tubes and the heat exchanged between the inlet and outlet stream serve to minimize the power necessary to apply to the Peltier device and maintain the low temperature. Thus all discussions included herein which refer to high-temperatures should also be construed to envision operation at temperatures below the temperature of the environment.

One embodiment a micromachined device constructed according to the present invention may include fluid conducting tubes with at least one static fluidic mixing structure protruding inwardly from the tube walls into the interior of the tube. These mixing structures can be designed by those skilled in the art to improve mixing in the fluid and may be important for reactions as well as heat transfer. These mixing structures may be positioned in an irregular pattern so as to result in a increased mixing behavior of the fluid within the tube. The mixing improves thermal uniformity of the fluid within the tube and decreases the diffusion distance of fluid components to the wall. The static mixing structures could also be used to mix at least two different fluid streams.

The present invention also anticipates the possible inclusion of heterogeneous catalyst into various portions of the micromachined device. The inner volume of the intermediate portion of the fluid conducting tube, which may be encased in the thermally conductive region, often must include catalyst. The posts or other equivalent structures described above may also serve the function of catalyst support in order to increase the catalyst area and decrease the distance fluid components must diffuse to contact catalyst.

The micromachined device of the present invention also may include other known structures for catalysis in fluidic systems. Such known structures include, for example, porous catalyst supports, closely spaced posts for use in trapping powdered catalyst or passive fluidic stop valves designed to localize catalyst deposited from solution. The space between a set of such "closely spaced posts" is smaller than particle size of catalyst to be retained.

Noble metal catalysts have been introduced successfully into the fluid conducting tubes by the inventors through standard wet impregnation techniques. In this procedure a compound of the noble metal (e.g., $H_2PtCl_6$ for platinum) is dissolved in water and wicked or pipetted into the fluid conducting tubes. Passive stop valves, further described below, can be used to determine the tube region wetted with catalyst precursor solution, and thus control the region of catalyst deposition. During evaporation of the water, the metal compound precipitates on the walls of at least a region of the fluid conducting tube. This solid is then reduced to a pure metal by reacting it with hydrogen at elevated temperature, as is known by those of ordinary skill in the art.

A number of techniques for packaging embodiments have been pursued by the inventors. The use of glass sealing techniques has been explored. The greatest success has been found with a glass transfer tape used as a preferred adhesion layer between the substrate and packaging layers. The glass tape has some benefits because it is thermally stable at high temperatures, which helps in manufacturing flexibility.

One representative class of applications of the present invention is as a gas-phase chemical reactor designed to conduct high-temperature reactions in an efficient manner in a small system. One particular application of a gas-phase reactor of this type is in fuel processing for portable power generation, as described previously.

An embodiment of the present invention, designed for the specific application of portable fuel processing and power generation, is the gas-phase chemical reactor designated generally as 1, shown schematically in FIGS. 1(a)–(c). This particular embodiment consists of a thermally conductive region 2 in which the chemical reaction may occur. The thermal conductivity of the material from which region 2 is constructed and the geometry of its structure allow the region 2 to be substantially isothermal when the reaction is occurring. The region 2 is connected to a substrate 3 by two fluid conducting tubes 5 and 6 in order to allow two separate fluid streams to be passed through the region 2. Fluid flows substantially along the longitudinal axis of each fluid conducting tube 5 and 6. For ease of presentation, going forward, the discussion will focus on fluid conducting tube 5. However, the following discussion applies equally to tube 6. Tube 5 is generally U-shaped and includes a thermally insulating inlet portion 5b, a thermally insulating outlet portion 5a, and intermediate portion 5c. As shown in FIG. 1(a), the tube 5 has a rectangular perimeter. It will be understood, however, that tube 5 may have a cross section that is circular or of any other closed shape. The inlet portion 5b and outlet portion 5a of the fluid conducting tube 5 are thermally connected by several thermally conductive structures 7, as described above, for heat recovery. The inlet portion 5b of the fluid conducting tube 5 is thermally connected to the outlet portion 5a of the fluid conducting tube 5 by way of thermally conductive structures 7. The outlet and inlet portions 5a and 5b of the fluid conducting tube 5 are in communication with the substrate 3 and may be accessed through ports 4 in the substrate 3. Fluids may be introduced to the inlet portion 5b or removed from the outlet portion 5a.

The fluid conducting tube 5 is fabricated from chemical-vapor-deposited (CVD) silicon nitride, preferably using the mold and release technique described below, and preferably has a wall thickness of 0.1–3 μm. The very small wall thickness inhibits conduction of thermal energy along the tube 5. The thermally conductive structures 7 and thermally conductive region 2 are composed of silicon, which has high thermal conductivity. The thickness of the minimum dimension of the thermally conductive structures 7 and the thermally conductive region 2 varies from 20–200 μm. The region of the inlet portion 5b and the region of the outlet portion 5a of the fluid conducting tube 5, which extend from the substrate 3 to the thermally conductive region 2, are each approximately 3 mm long and the inlet and outlet portions are spanned by 3–14 thermally conductive structures. It to be understood that while additional structures improve heat recovery, decreasing marginal utility is seen with each additional structure. The thermally conductive structures 7 are 50–500 μm wide (measured parallel to the longitudinal axis of the fluid conducting tube 5) and fully surround a region of the inlet portion 5b of the fluid conducting tube 5 and a region of the outlet portion 5a of the fluid conducting tube 5. The thermally conductive region 2 is approximately 2 mm long and 1.6 mm wide. Within the region 2, the inlet portion 5b of the fluid conducting tube 5 and the outlet portion 5a of the fluid conducting tube 5 are connected by the intermediate portion 5c of the fluid conducting tube 5, which may be a simple "U" shape that is encased within the region 2 such that heat generated within the intermediate portion 5c will be conducted into and throughout the region 2. The fluid conducting tubes 5 and 6, thermally conductive structures 7, and thermally conductive region 2 preferably are packaged in vacuum in order to minimize conductive and convective heat losses to the surroundings. Region 2 is also intended to conduct heat between the intermediate portions of tubes 5 and 6. Thermally conductive structures 7 are used for heat recuperation between the inlet portion 5b and outlet portion 5a of tube 5.

Figure 2:
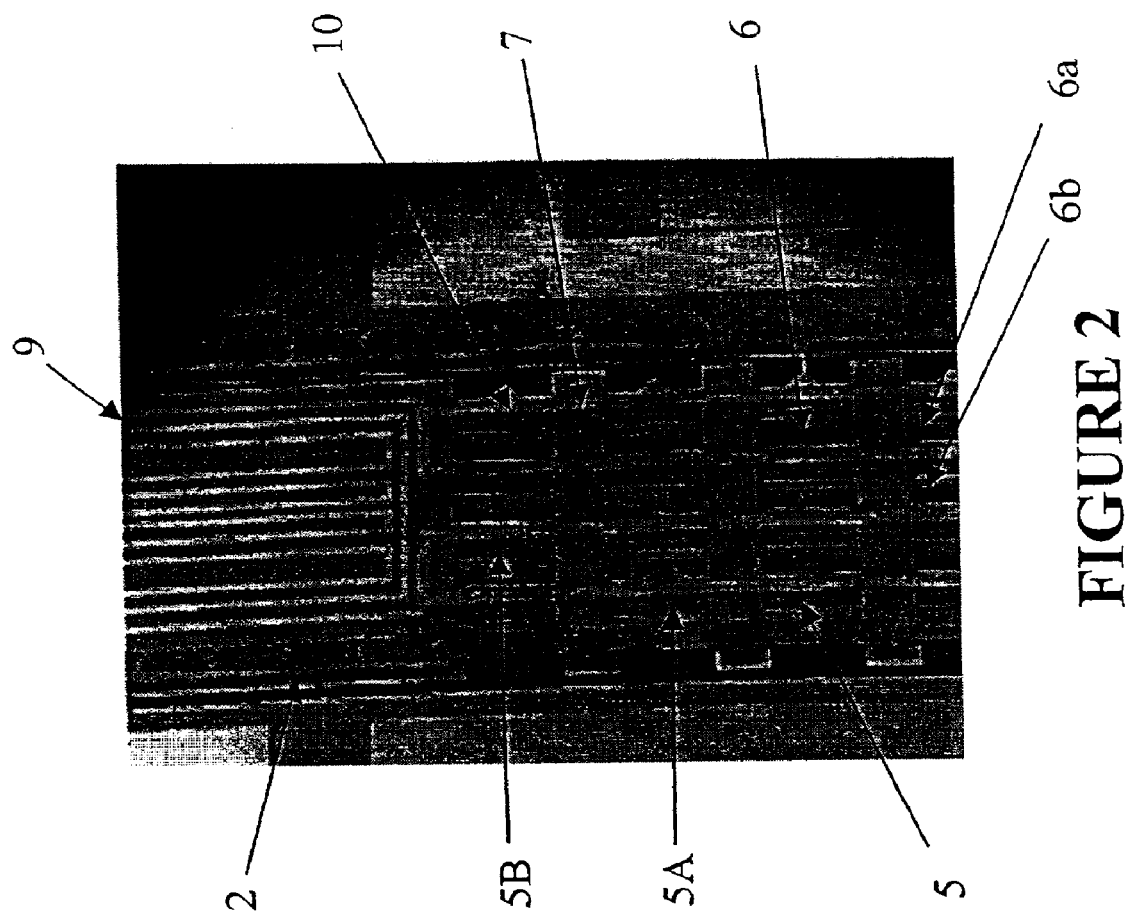
FIG. 2 is a scanning electron micrograph taken at approximately 20× magnification of an embodiment of a micromachined device adapted for processing a fluid and constructed according to the present invention.

FIG. 2 is a scanning electron micrograph at 20× magnification of an embodiment of the invention constructed as generally shown in FIGS. 1(a)–(c). For that reason the element numbering used in FIGS. 1(a)–(c) is used in FIG. 2. A resistive heater trace 9 which also serves as a temperature sensor, may be integrated into the structure to allow for electrical heating (for example, during startup), as well measurement of temperature during operation. The resistive heater trace 9 is disposed on an exterior surface of the thermally conductive region 2 and heats the region 2 to the desired operating temperature. The resistive heater trace 9 has a plurality of electrical leads 10. The inlet portion 5b and 6b of the fluid conducting tube 5 and 6 and the outlet portion 5a and 6a of the fluid conducting tube 5 and 6 are disposed below the leads 10. The intermediate portion (not shown) of the fluid conducting tube 5 and 6 is encased in the thermally conductive region 2. Thermally conductive structures 7 span the gap between the inlet portion 5b and outlet portion 5a of tube 5 and the gap between the inlet portion 6b and outlet portion 6a of tube 6.

Figure 3:
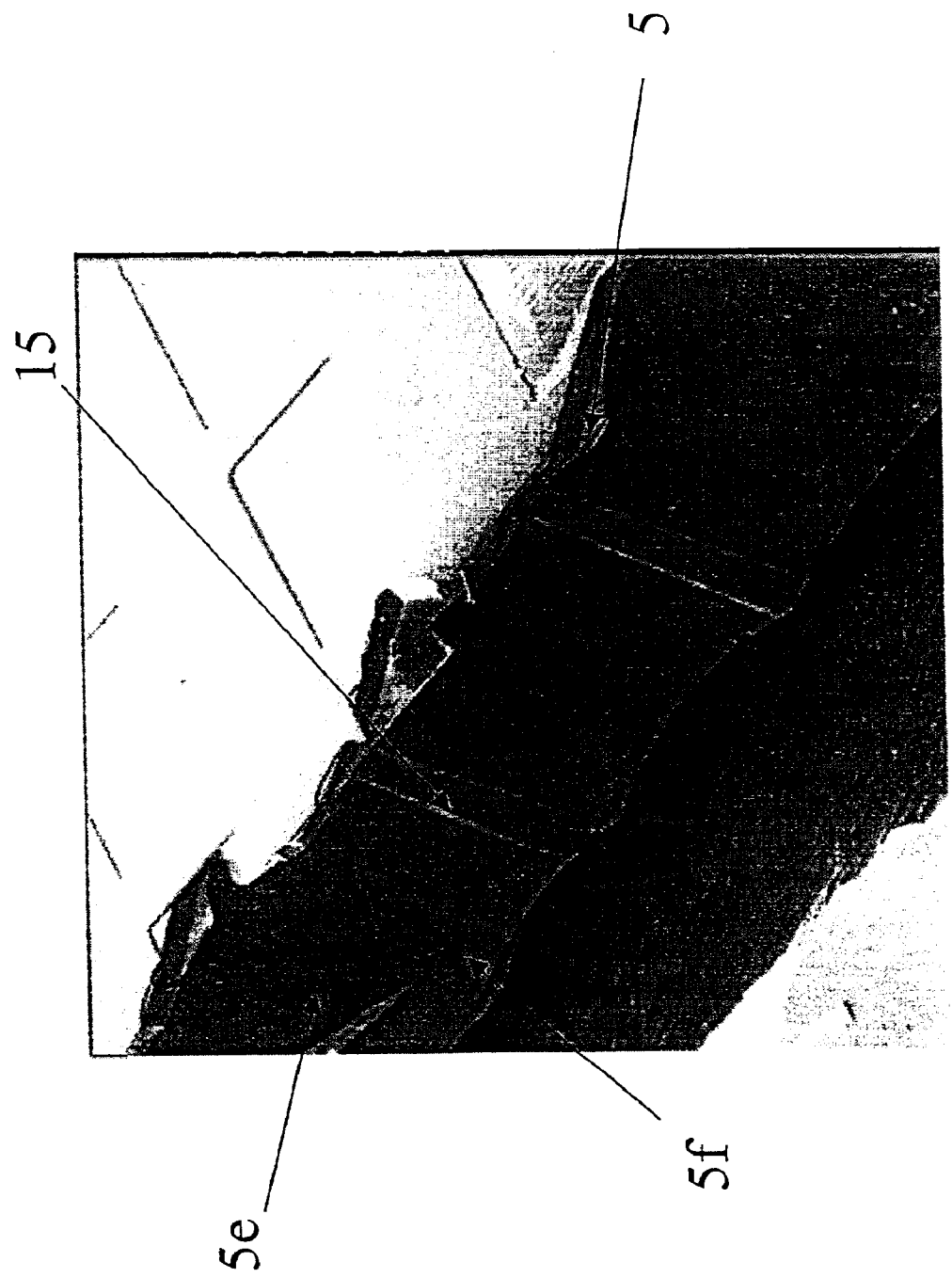
FIG. 3 is a scanning electron micrograph taken at approximately 100× magnification of a region of an embodiment of a micromachined device adapted for processing a fluid and constructed according to the present invention, and particularly showing posts according to the invention.

FIG. 3 is a scanning electron micrograph of a fluid conducting tube 5 showing posts 15 projecting from the tube walls and disposed within the inner volume of the fluid conducting tube 5. The posts 15 are disposed between the bottom wall 5f of the fluid conducting tube and the top wall (not shown) of the fluid conducting tube. A side wall 5e of the fluid conducting tube is also shown, removed by a gap from the posts 15. These posts 15 may be disposed in one or more of the inlet portions of the fluid conducting tube, the outlet portion of the fluid conducting tube, and the intermediate portion of the fluid conducting tube. The arrangement of the posts 15 in FIG. 3 is meant by way of example only and in no way indicates any limitation on the configuration of posts contemplated by the present invention.

Figure 4A:
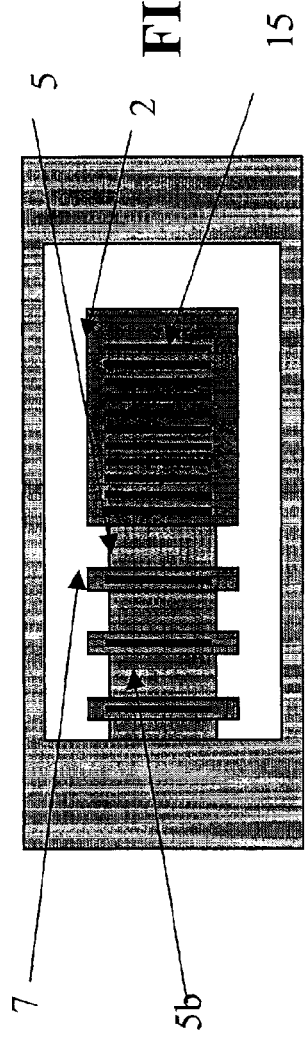
FIG. 4(a) is a schematic representation of an embodiment of the present invention incorporating posts.
Figure 4B:
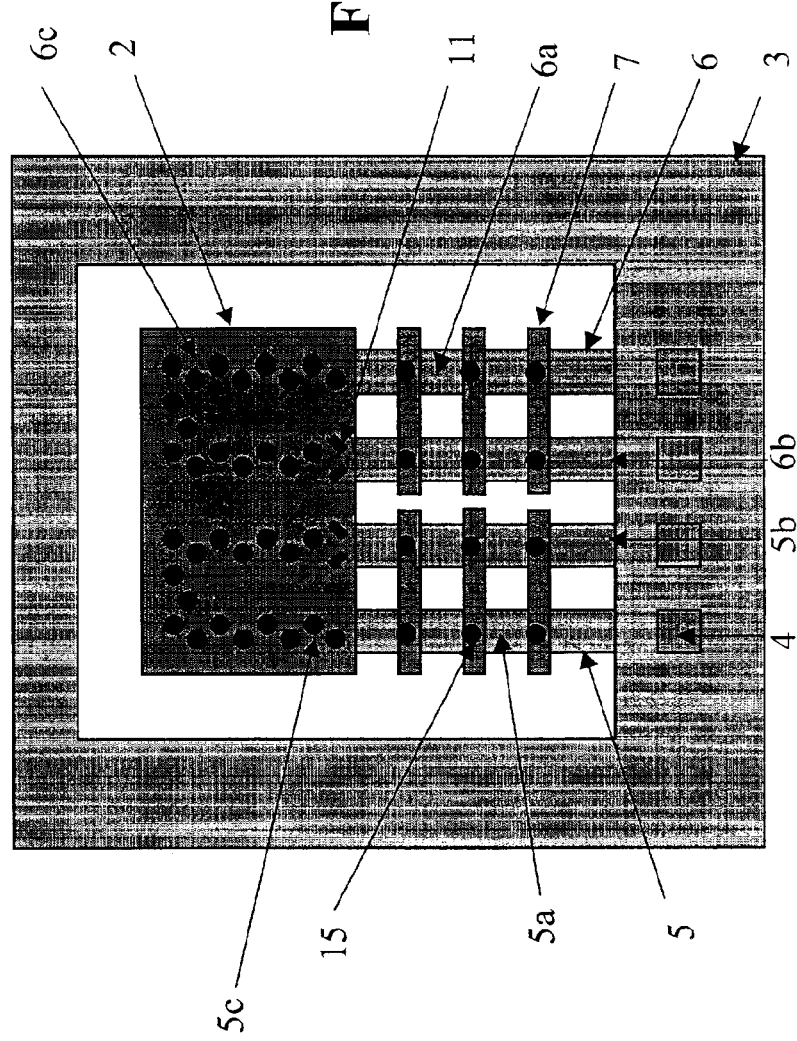
FIG. 4(b) is a top view of the embodiment of FIG. 4(a) further including passive fluidic stop valves.

Additionally, non-limiting examples of post 15 disposition are seen in FIG. 4(a) and FIG. 4(b). FIG. 4(a) is a schematic representation of an embodiment of the invention and particularly shows a possible position of posts 15 disposed along with thermally conductive structures 7 in the inlet portion 5b of the fluid conducting tube 5. Posts 15 will enhance conduction of thermal energy from the fluid in the vicinity of the thermally conductive structures 7 to the wall of the tube 5, where heat may then be transferred to regions of lower temperature through the structures 7. Thus, the combination of posts 15 and structures 7 will further assist in preventing dissipation of heat away from the intermediate portion 5c of tube 5. Posts 15 are also disposed in the intermediate portion 5c of the fluid conducting tube 5. The intermediate portion 5c is encased in the thermally conductive zone 2.

FIG. 4(b) is a schematic top view of the embodiment of FIG. 4(a). FIG. 4(b) shows two fluid conducting tubes 5 and 6. The embodiment shown in FIG. 4(b) also includes passive fluidic valves 11 for catalyst deposition within the tubes. The stop valves 11 serve to control fluid flow within the fluid conducting tube 5 such that catalyst is deposited upon the walls of the fluid conducting tube 5 upon evaporation of a catalyst containing fluid.

The device of the present invention may be fabricated according to the method illustrated in FIGS. 5(a) through 5(k). The goal of the first several steps of the method is to provide a structure that will serve as a mold onto which the material of which the tubes are made is deposited. The mold will not only include structures that will define the tubes, but also will include buried release pits, which will not be coated with material by the tube deposition process and will later serve to define the thermally conductive structures and the thermally conductive region. Release pits are critical to the fabrication process. Release pits are cavities within the mold which are inaccessible during deposition of tube material, but are accessed during removal of parts of the mold using a chemical etch. Essentially they define thickness of the tube mold side walls, which allows some mold sidewalls to be completely removed while leaving mold side wall material in other regions, as described in the following paragraphs.

The present discussion will focus on a process utilizing at least two substrates. However, a number of approaches may be used to provide the mold structure, including the use of only one substrate. More than two patterned or unpatterned substrate layers of varying thicknesses could be laminated together to achieve this structure. Herein described is a two-substrate process having several variations. The inventors have successfully used the two-substrate process to form the tube mold structures used to create fluid conducting tubes of micromachined devices of the present invention.

Figure 5A:
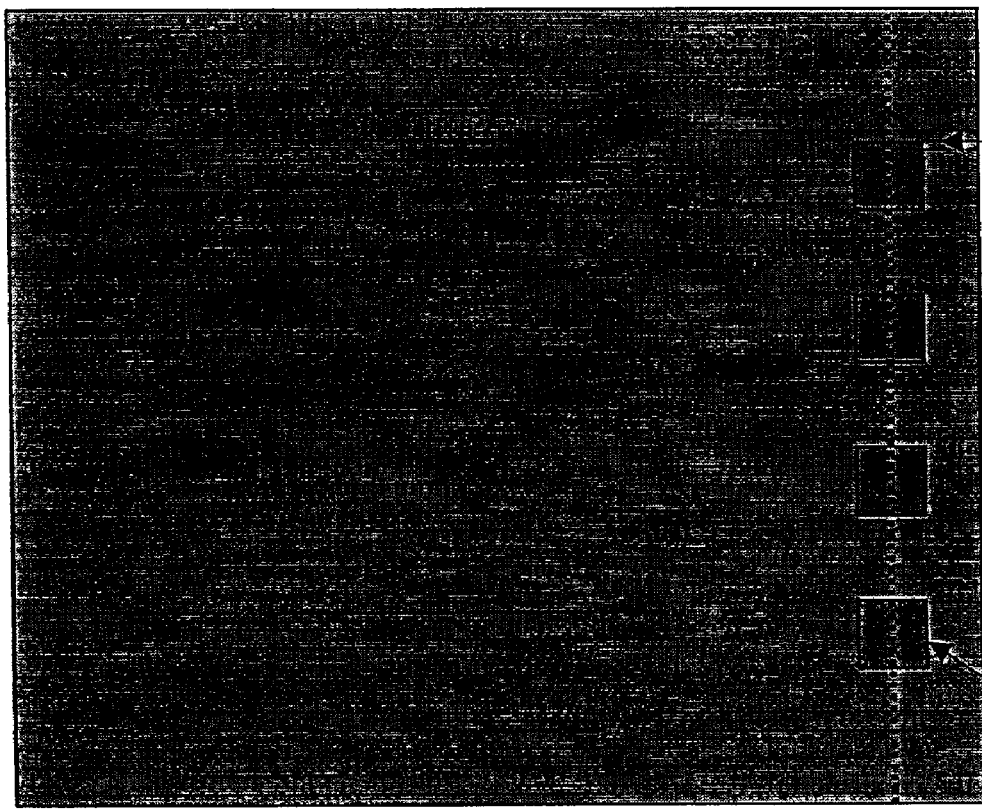
Figure 5B:
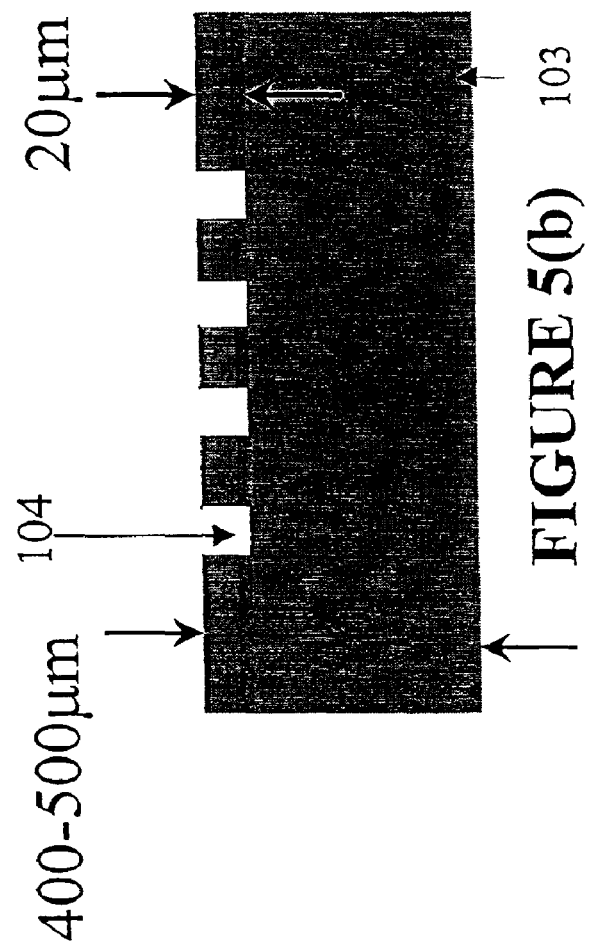
Figure 5C:
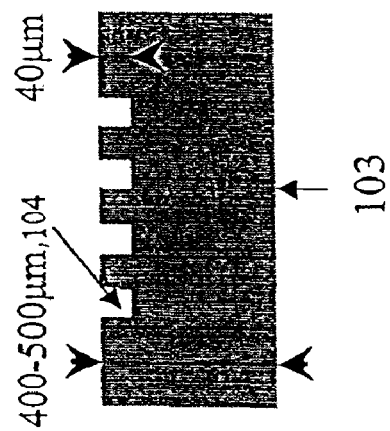

The two-substrate process begins with a thin substrate. The materials used for the substrate may include, for example, SOI (silicon on insulator) wafers and plain silicon wafers. An SOI wafer allows a more uniform definition of tube shapes in the subsequent processing steps, but a plain silicon wafer also works well. The substrate 103 is patterned with relatively shallow holes on one side, as shown in FIGS. 5(a)–5(c). A dry or wet etchant may be used to pattern the substrate 103. In the present example, a deep reactive ion etch (DRIE) process is used to pattern the silicon.

Figure 5D:
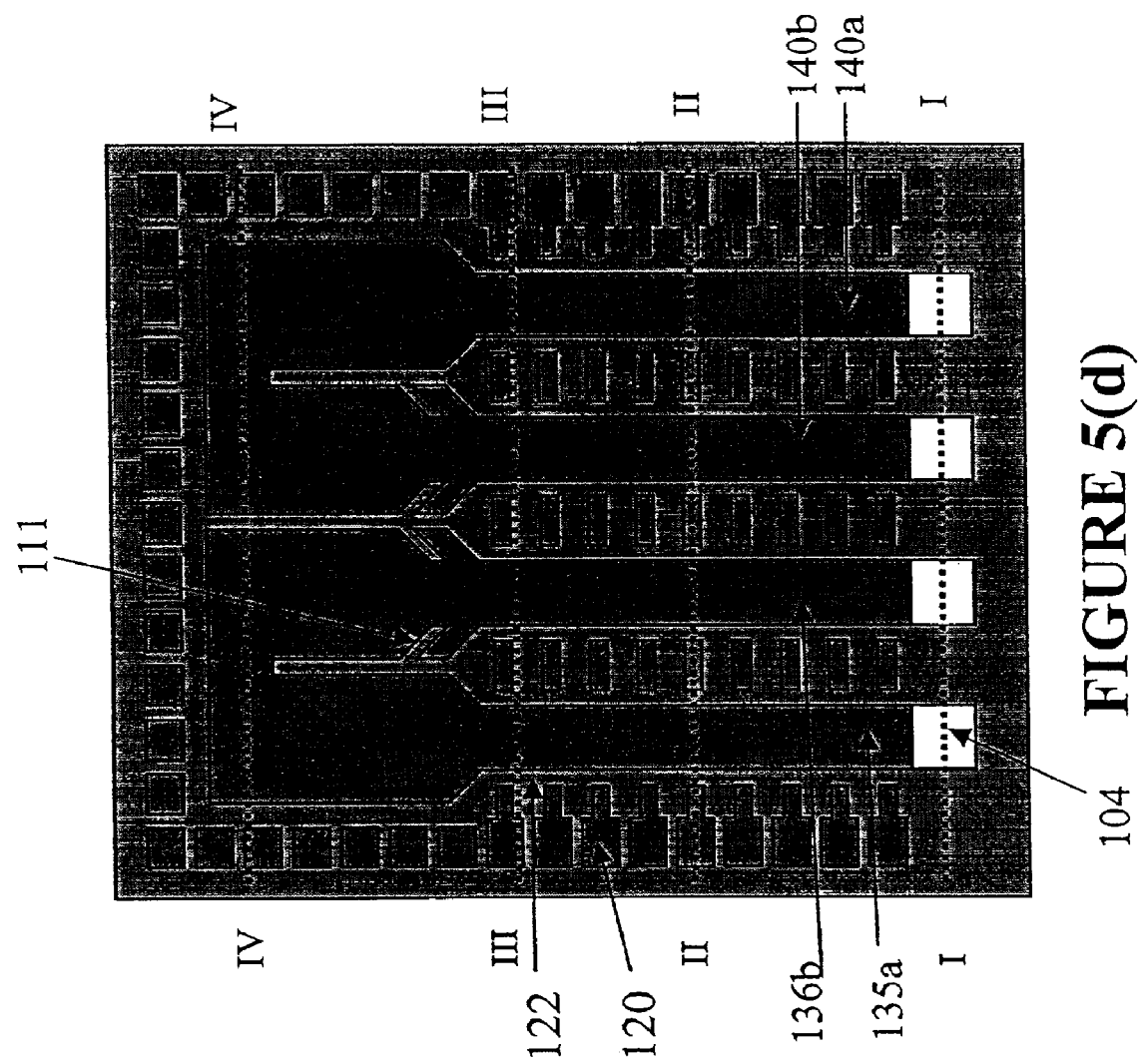
Figure 5E:
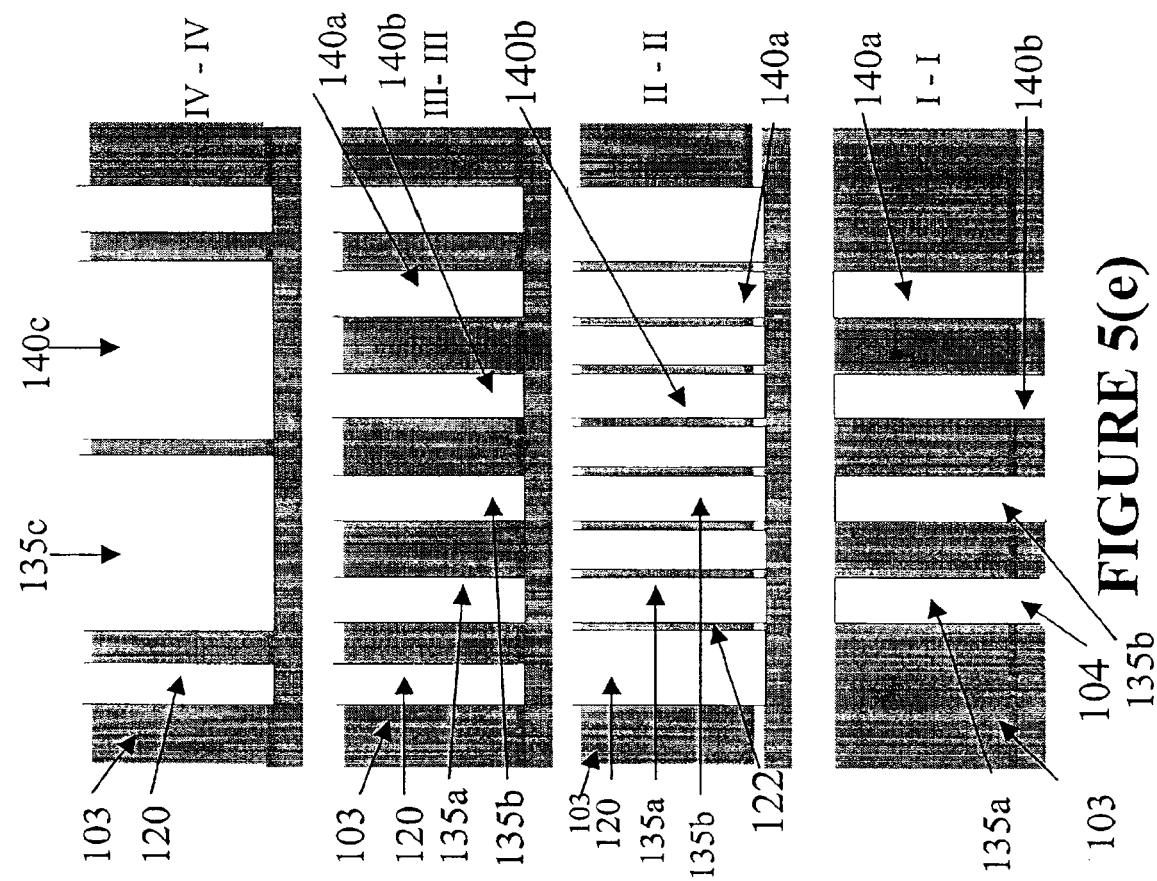

The substrate 103 is then patterned from the opposite side such that the substrate 103 is patterned entirely through in regions of the initial shallow pattern. This patterning can also be accomplished using any suitable wet or dry etchant, and the DRIE process was again utilized in this example. This patterning step is crucial for establishing the final device geometry. The shape of a tube mold 135a and 135b and a second tube mold 140a and 140b is determined in this step, as seen in FIGS. 5(d) and 5(e). FIG. 5(e) is a cross section of the device of FIG. 5(d) at positions I—I, II—II, III—III and IV—IV. For ease of presentation, going forward only tube mold 135a and 135b will be discussed, unless indicated otherwise. Any discussion of tube mold 135a and 135b, however, is equally applicable to tube mold 140a and 140b. The release pit 120 geometry is also determined at this step. The shape of the tube mold 135a and 135b and the shape of the surrounding release pits 120 determine the thickness of the mold walls. Varying this thickness, combined with a subsequent etch to remove sections of the mold walls 122, determines the final device shape. For example, as seen in FIG. 5(e), the walls at position II—II of the tube mold, are much thinner than the walls of the tube mold at position III—III. Accordingly, if both areas are exposed to the same etchant for the same time period there will be wall fragments remaining at position III—III, but not at position II—II.

It is also during this second pattering step that features extending from the tube walls into the tubes can be provided. FIG. 5(d) shows passive fluidic stop valves 111, which aid in catalyst deposition later in the process. The fluidic stop valves are formed using the DRIE process as set forth above. Similarly, posts made out of substrate material can be patterned throughout the tube mold space using the DRIE process. The posts increase surface area of the catalyst and assist in achieving uniform heat distribution from the fluid in the center of the tube out to the tube wall. Fluidic mixing structures made out of substrate material may also be patterned throughout the tube mold space using the DRIE process. These mixing structures can improve mixing of the fluid and may be important for reactions as well as heat transfer. The ability of this process to utilize almost arbitrarily complex device geometries without impacting the overall processing is important for design optimization.

Following the patterning of tube molds and release pits, the tube mold and the release pits are capped with a substrate material roof 125, ie., the fourth wall, as shown in FIGS. 5(f) through 5(i). FIG. 5(g) is a cross section of the device of FIG. 5(f) at positions I—I, III—III and IV—IV, while FIG. 5(i) is a cross section of the device shown in FIG. 5(h) at positions I—I, II—II, III—III and IV—IV. Again, the walls at position II—II of the tube mold, are much thinner than the walls of the tube mold at position III—III. Accordingly, if both areas are exposed to the same etchant for the same amount of time, there will be wall fragments remaining at position III—III, but not at position II—II. Several strategies can be used for the capping layer. A thick substrate material roof 125 can be bonded to the original substrate 103, and then thinned back to desirable thickness through either chemical or mechanical machining. Alternatively, an SOI wafer can be bonded with the thin silicon side down. The buried oxide in this case provides an etch stop for the chemical thin back of the substrate material roof 125, leaving a thin roof layer defined by the original thickness of the SOI layer. In another alternative, a substrate of desired thickness can be bonded directly to the patterned substrate 103.

Figure 5F:
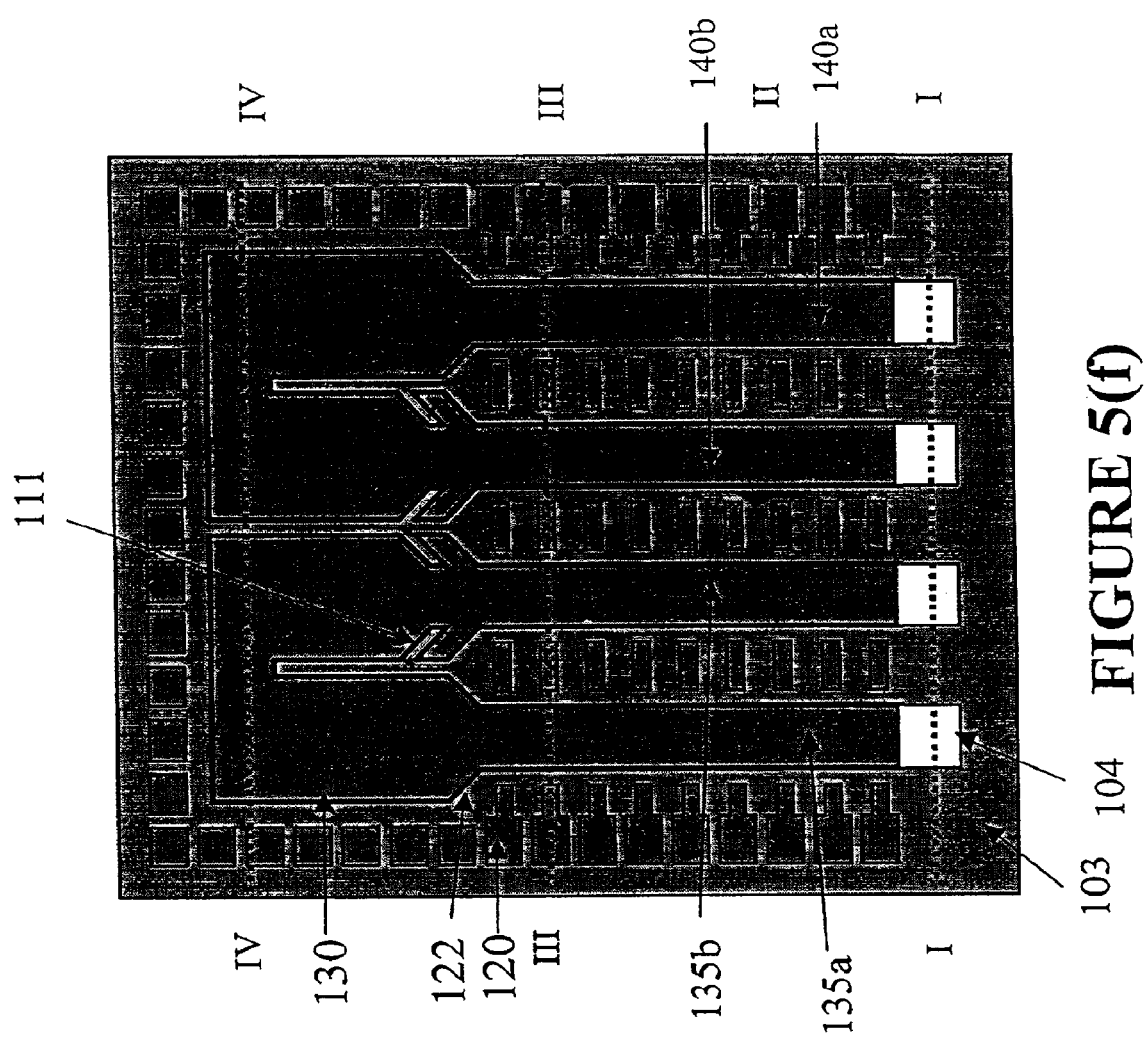

Silicon capping substrates only 20 μm thick have been utilized in the fabrication process, as well as SOI wafers. Importantly, the capping substrate thickness determines the thickness of the top walls in structures 102 and 107, as seen in FIG. 5(i). FIGS. 5(f) and 5(g) show the process with an SOI wafer used as the substrate material roof 125 before thin back, while FIGS. 5(h) and 5(i) show the process with an SOI roof 125 wafer after thin back.

The capping step completes fabrication of the tube mold substrate with embedded release pits. As mentioned above, this fabrication can also be achieved in a variety of other ways. For example, more than two substrate layers can be laminated together to build up the mold structure and release pits. The structure could also be built using electroplating with sacrificial layers or other rapid prototyping approaches.

Following the capping step, the tube material 130 is deposited on all the exposed surfaces of the mold, as also illustrated in FIGS. 5(f) and 5(g). The inventors have utilized a low pressure CVD technique to deposit silicon-rich silicon nitride films 2 μm thick. Electroplating or electroless plating, wet deposition of ceramics using sol gels, and other processes known to those skilled in the art may also be used to achieve the deposition of other tube materials. A key feature of this step is that the release pits 120 have been sealed in during the capping step, and are not exposed during the deposition step. The tube material is therefore not deposited inside the release pits 120. Once the release pits 120 are exposed in subsequent processing, the substrate 103 surrounding these release pits 120 can be selectively removed while leaving the tube formed in the tube mold 135a and 135b intact. This removal is accomplished by using a liquid or gaseous etchant that selectively removes the substrate but not the tube material.

Figure 5H:
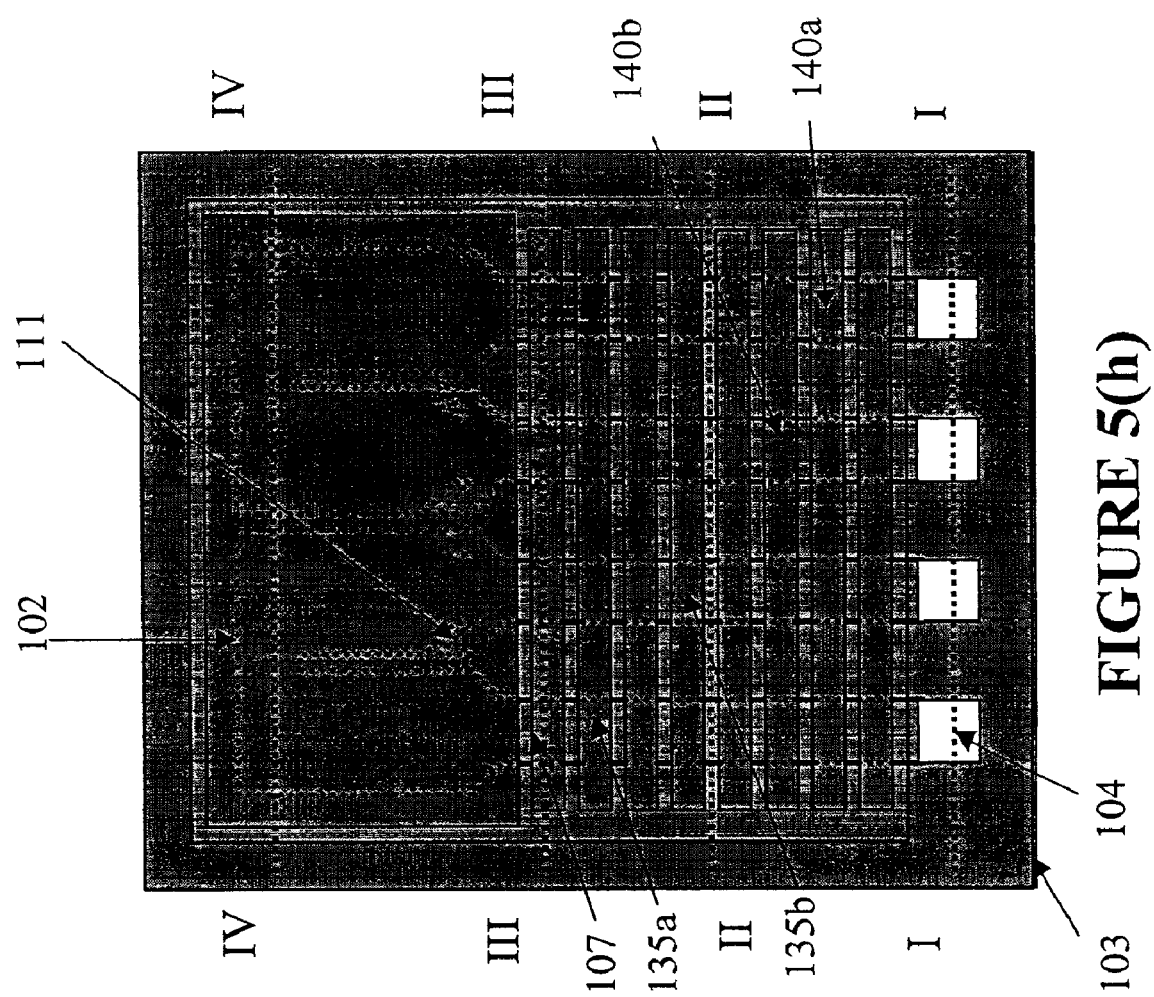

The next step, shown in FIGS. 5(h) and 5(i), is directed to pattern masking layers on at least a region of both the top and bottom of the substrate 103. If the capping layer selected is an ultrathin substrate, both sides of the substrate mold will be coated with tube material, which can be patterned using photolithography and etching, for example. If an SOI capping layer is used, the silicon will be thinned back to the buried oxide layer, in which case the buried oxide may be patterned. If a thick plain substrate is used, the substrate will be thinned back and an appropriate masking layer will have to be deposited and patterned on the masking surface. These masking layers protect the substrate in strategic areas from removal during the device release etch.

At this step one may also deposit and pattern other materials on the surface of the substrate mold. For example, the inventors have deposited thin films of platinum with a thin titanium adhesion layer to serve as heaters and resistive temperature sensors through methods known to those of ordinary skill in the art. Specifically, physical vapor deposition using electron-beam evaporation was employed.

Figure 5J:
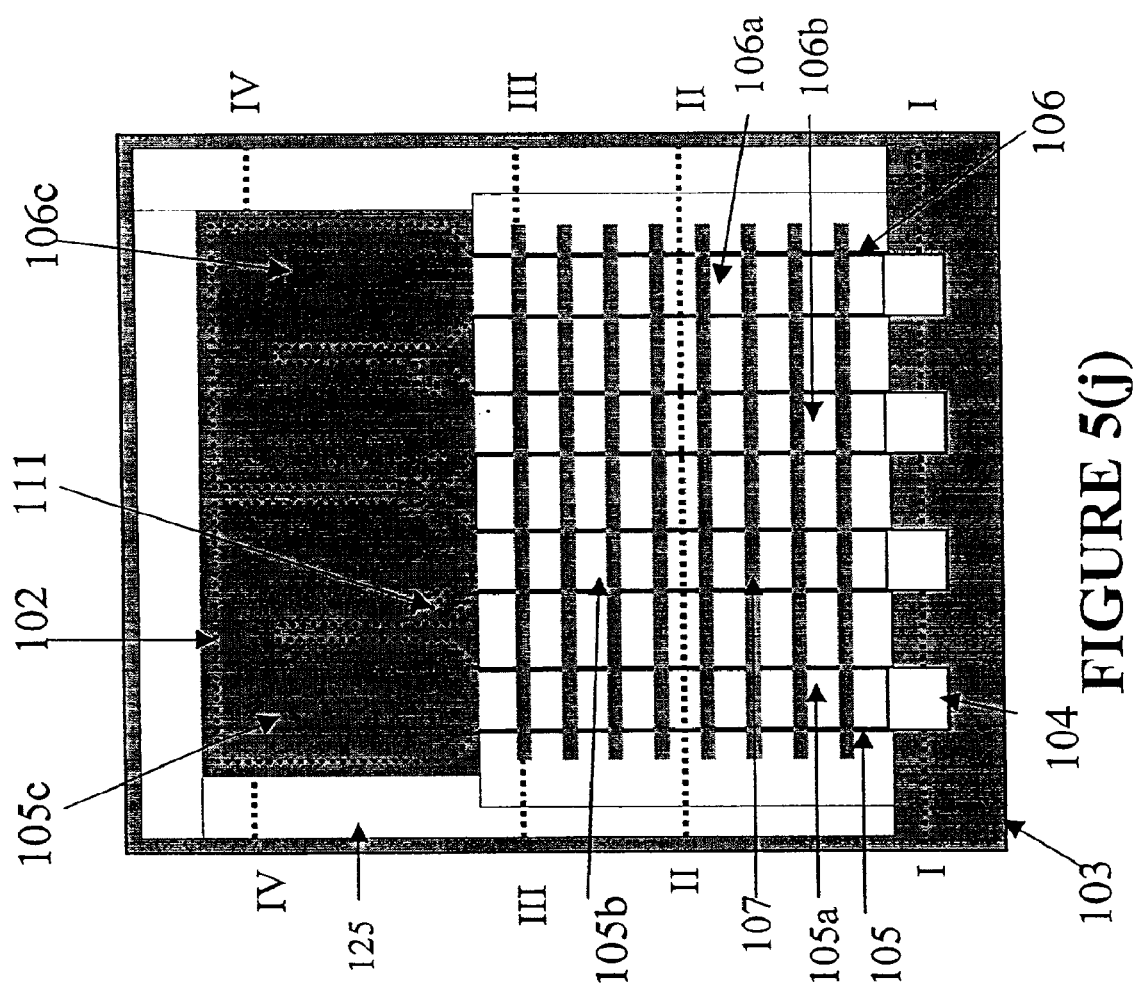

Once the substrate 103 is exposed in strategic areas, the substrate may be exposed to a substrate etchant for a timed etch. FIGS. 5(j) and 5(k) show the final released tube structure. FIG. 5(k) is a cross section of the device of FIG. 5(j) at positions I—I, II—II, III—III and IV—IV. The etch is controlled, for example through timing, such that the thin substrate walls are removed completely while leaving substrate in areas with thick or masked substrate walls. For silicon substrates a number of silicon etchants have been used with good results, including potassium hydroxide solution, xenon difluoride, fluorine, nitric acid/hydrofluoric acid mixtures, etc. Two fluid conducting tubes 105 and 106 are shown. For ease of presentation, going forward, the discussion will focus on fluid conducting tube 105. However, the following discussion applies equally to tube 106. The fluid conducting tube has a thermally insulating inlet portion 105b, a thermally insulating outlet portion 105a, and an intermediate portion 105c. At least part of the intermediate portion 105c contains at least one passive fluid stop valve 111 and is encased in a thermally conductive region 102. The inlet portion 105b and the outlet portion 105a are contacted by thermally conductive structures 107. The fluid conducting tube 105 is encased within the substrate 103 and the inlet portion 105b and the outlet portion 105a may be accessed by way of ports 104.

Catalyst may be deposited inside the tubes using a variety of methods, including, for example, wet impregnation techniques, CVD or plating.

Importantly, through the DRIE etching process described above, any part of the substrate mold can be made to remain integrated with the tube material. Through this process the thermally conductive structures are integrated with the thermally insulating tubes. Further, the substrate material can be selected to remain on one, two, three, or all four sides of the tube material.

The thickness of the substrate material integrated with the tubes can be controlled through controlling thickness of top/bottom capping layers and the thickness and shape of the pattern in FIGS. 5(d) and 5(e). The depth of the tubes may also be controlled by controlling the thickness of the substrate to be patterned in FIGS. 5(d) and 5(e) and/or adjusting the etch depth.

The ability to leave, in a controlled way, portions of the substrate mold integrated with the tubes themselves is a substantial improvement over the prior art. This is achieved by including well defined release pits in the original mold substrate in areas of the mold that are to be removed and by masking substrate surfaces with a desired pattern in areas of the mold that are to be retained in the final micromachined device. It is to be understood that while FIGS. 5(a)–(k) address a micromachined device, the process of using a structured mold to form integrated structures, which are structures that remain together after material removal steps, may be useful for a variety of non-micromachined applications.

FIG. 6(a) depicts a top view of an embodiment of the present invention showing the utilization of vacuum packaging 12, reflective coating 31, and low emissivity coating 32, the benefits of which have been set forth above. FIG. 6(b) is a side view of the embodiment of FIG. 6(a) further showing the use of a packaging layers 33 above and below the device layer 1a.

Figure 7:
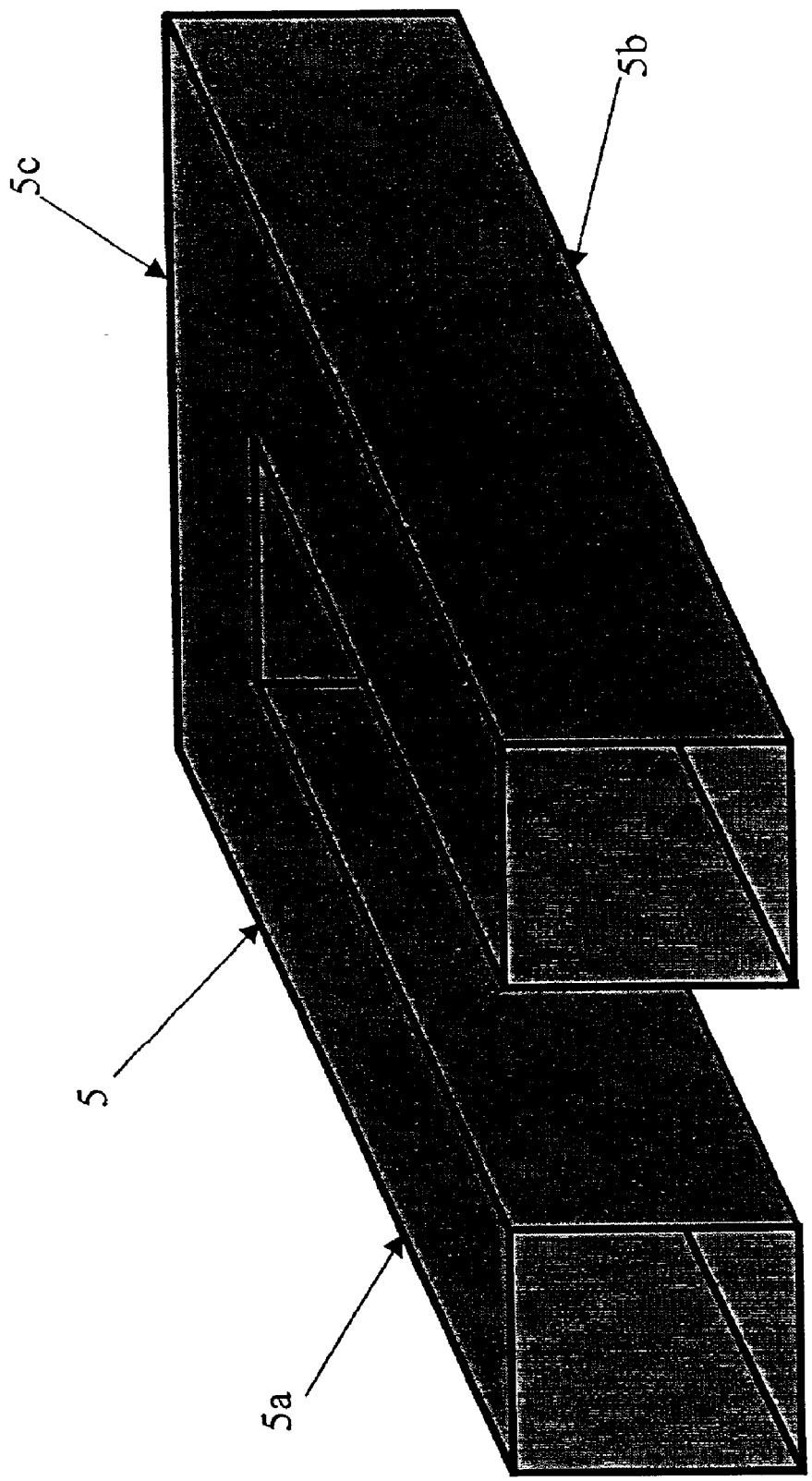
FIG. 7 depicts an embodiment of a generally U-shaped thin-walled tube of the present invention.

FIG. 7 depicts an embodiment of a thin-walled tube of the present invention. In this embodiment, the fluid conducting tube 5 is substantially U-shaped and possesses an inlet portion 5b, an outlet portion 5a and an intermediate portion 5c.

EXAMPLE 1

Figures 8A, 8B:
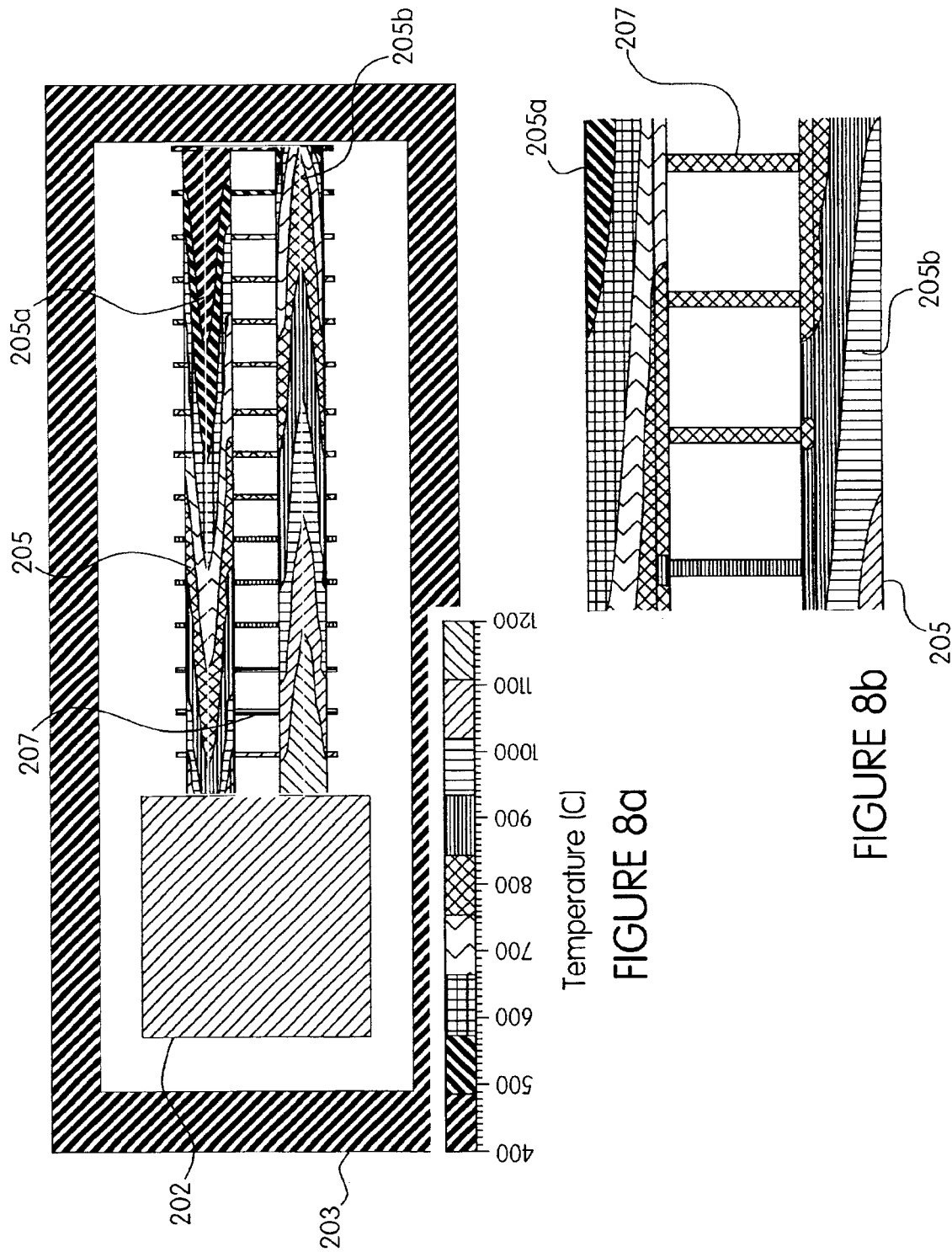
FIG. 8(a) and FIG. 8(b) illustrate the results of a finite element simulation of fluid and heat flow in the inlet and outlet portions of a fluid conducting tube in an embodiment of a fluid-processing micromachined device constructed according to the present invention.

FIG. 8(a) and FIG. 8(b) show the results of a finite element simulation of fluid and heat flow in one fluid conducting tube 205 in a micromachined device constructed according to the present invention and adapted for combusting a fuel. This particular simulation models the heat exchange for a device burning 1 watt of a stoichiometric butane-air mixture at 1652° F. (900° C.) with the substrate held at 86° F. (30° C.), neglecting losses from the exterior surface of the tube and thermally conductive structures. Note, however, that any combustible fuel may be used. The cold stream of fluid enters the inlet portion 205b of the fluid conducting tube 205 from the substrate 203, is preheated by the fluid exiting the thermally conductive region 202, combusts in the intermediate portion of the fluid conducting tube (which is encased in the thermally conductive region 202), and returns to the substrate 203 via the outlet portion 205a of the fluid conducting tube 205. These simulations indicate that between 50–70% of the heat in the hot stream exiting the thermally conductive region can be recovered using this design and the recovered heat may be used to preheat the entering stream over the 3 mm long heat recovery section of the fluid conducting tube 205. Calculations also indicate that the conductive loss through the tube is approximately 0.1 W at a thermally conductive region operating temperature of 1652° F. (900° C.).

EXAMPLE 2

Figure 9:
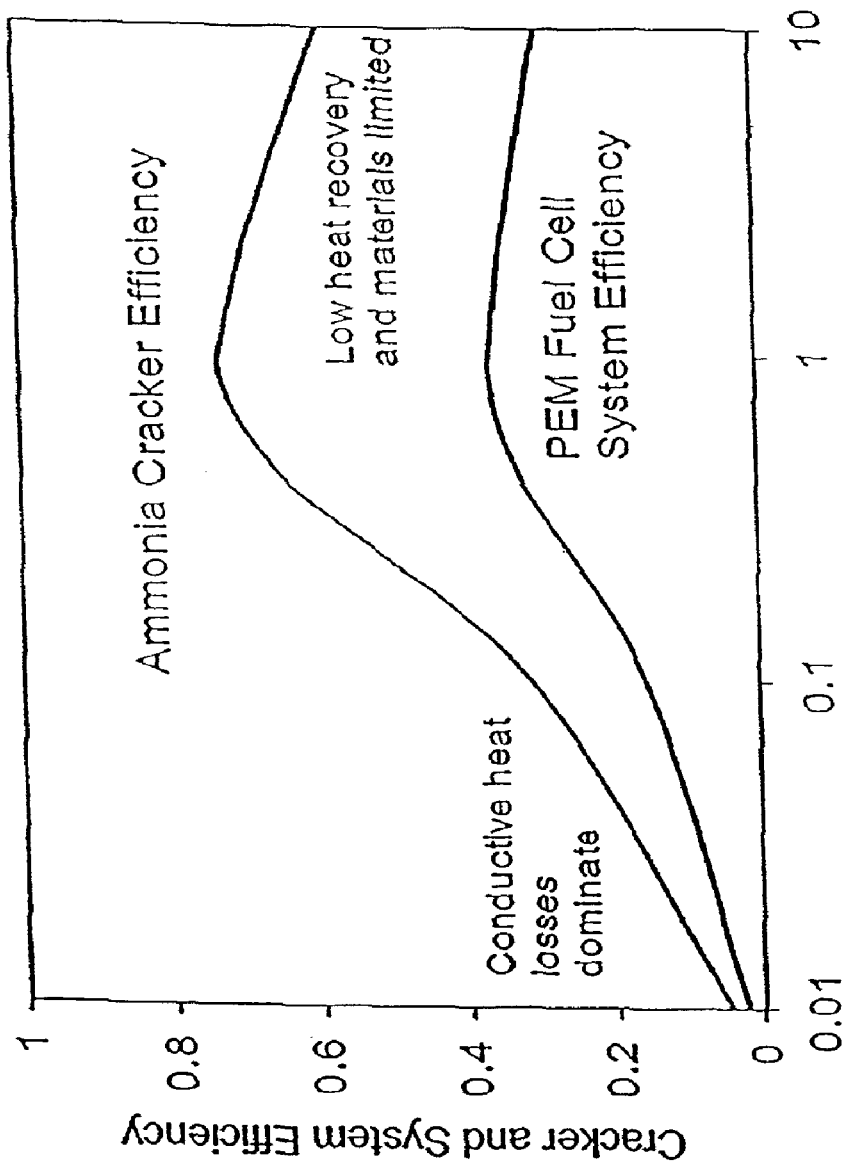
FIG. 9 is a graph showing simulated ammonia cracker and system efficiency as a function of system power for a micromachined device constructed according to the present invention and incorporating a conventional proton exchange membrane (PEM) fuel cell system.

Theoretical analysis of the behavior of the thermally conductive region as an ammonia cracker has been carried out. Results of this analysis are provided in FIG. 9. The system was assumed to use the combustion of hydrogen from a fuel cell anode to supply the energy to achieve elevated temperatures in the thermally conductive region for the endothermic ammonia cracking reaction. It was assumed that enough catalyst would be present to crack 30 sccm of ammonia at 1652° F. (900° C.). The temperature of the thermally conductive region was varied to reflect the need for higher cracking temperatures at higher ammonia flow rates. An optimal operating point for the device based on the increased importance of conductive thermal losses for lower power operation and poor recuperation of exhaust heat at higher power levels and ammonia flow rates is expected.

EXAMPLE 3

Figure 10A:
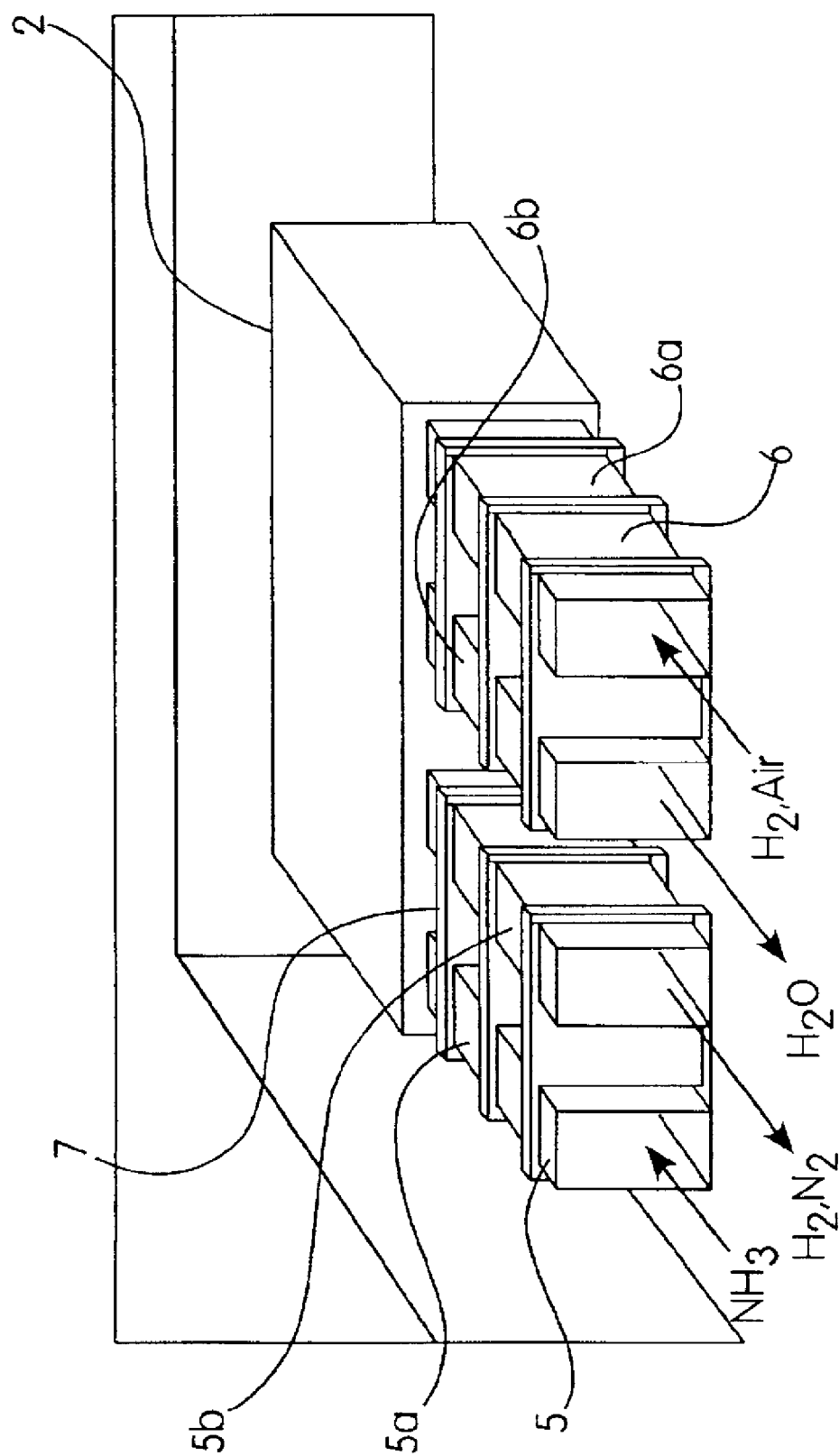
FIG. 10(a) depicts a process of ammonia cracking that may be carried out in a micromachined device constructed according to the present invention.

As depicted in FIG. 10(a), one particular approach to using the described gas-phase reactor of the present invention in a portable power application is the thermal decomposition of a fluid reactant into fluid products. In this example the fluid reactant is ammonia gas and the fluid products are hydrogen and nitrogen for use in a fuel cell. Hydrogen is the preferred fuel of many fuel cell systems. It is, however, difficult and dangerous to store and transport. This approach allows ammonia to be transported, which results in increased energy storage density.

The ammonia decomposition approach would use the thermally insulating inlet portion 5b of a fluid conducting tube 5 to carry ammonia gas into intermediate portion 5c of the fluid conducting tube 5. The intermediate portion 5c is encased in the thermally conductive region 2, which is comprised of silicon or another material of high thermal conductivity. The thermally conductive region 2 is maintained at an elevated temperature, causing the ammonia gas to decompose (possibly with the assistance of a catalyst in the intermediate portion 5c). The material of which the thermally conductive region 2 is composed is selected so that the region 2 is substantially isothermal during operation of the device of FIG. 10(a). The thermally insulating outlet portion 5a of the fluid conducting tube 5 carries the nitrogen and hydrogen products of the decomposition of the ammonia back to the substrate 3, where they would be directed to a fuel cell (not shown). The hydrogen not consumed by the fuel cell may be combined with air and fed back through the thermally insulating inlet portion 6b of a second fluid conducting tube 6 into the intermediate portion 6c of the second fluid conducting tube 6. As shown in FIG. 10(a), the second fluid conducting tube is encased in the thermally conductive region 2 so that the intermediate portions 5c and 6c are adjacent. The hydrogen fed through the second tube 6 would react with air (possibly with the assistance of a catalyst) in the intermediate portion 6c to produce water and heat. The heat generated by combustion of the hydrogen would be used to maintain the elevated temperature of the thermally conductive region 2 to supply the energy absorbed by the decomposition of the ammonia to generate additional hydrogen for the fuel cell.

EXAMPLE 4

Figure 10B:
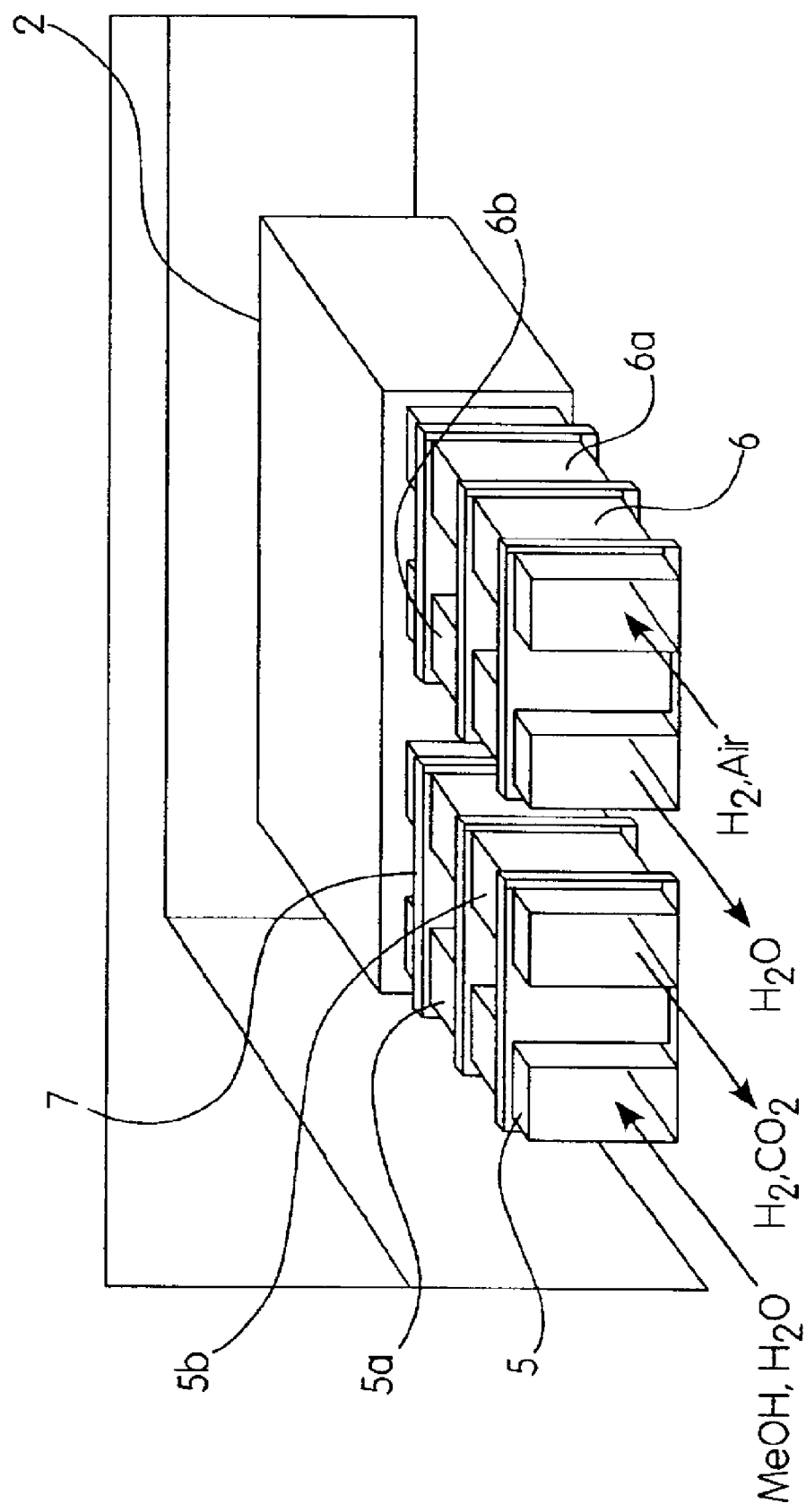
FIG. 10(b) depicts a process of methanol reformation that may be carried out in a micromachined device constructed according to the present invention.

FIG. 10(b) depicts an embodiment of the present invention constructed as in FIG. 10(a) and used for portable power generation, but carrying out the steam reforming of methanol. As with ammonia cracking in Example 3 above, hydrogen is the desired product. The system design may be very similar to that for ammonia decomposition, but a 1:1 methanol-water mixture is the fluid reactant from which hydrogen and carbon dioxide are provided as fluid products. Again, some portion of hydrogen not consumed by the fuel cell would be combined with air and used to maintain the elevated temperature of the thermally conductive region 2 and supply heat to the reaction.

EXAMPLE 5

Figure 10C:
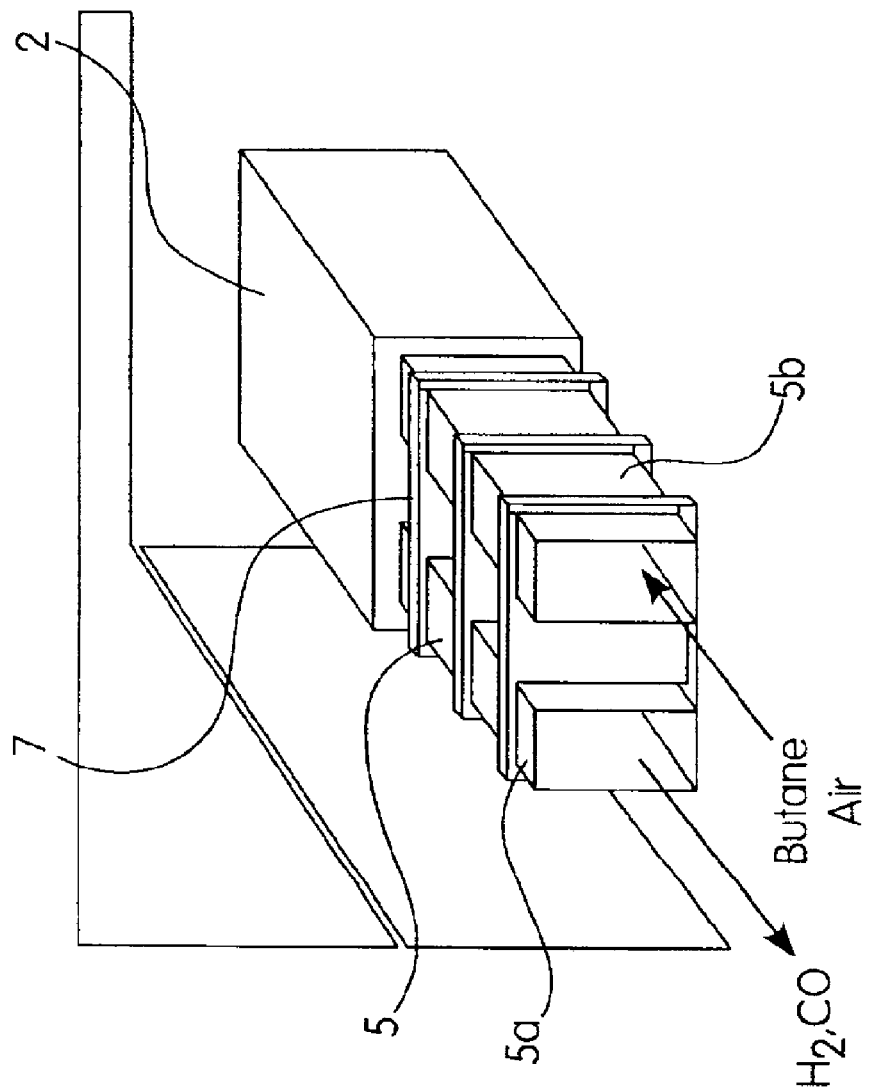
FIG. 10(c) depicts a partial oxidation of butane as may be carried out in a micromachined device constructed according to the present invention.

FIG. 10(c) depicts the partial oxidation of butane as carried out by an embodiment of the present invention utilizing one fluid conducting tube. Butane is partially oxidized resulting in the generation of hydrogen and carbon monoxide. The products may then be transported to and used in a fuel cell.

EXAMPLE 6

Figure 10D:
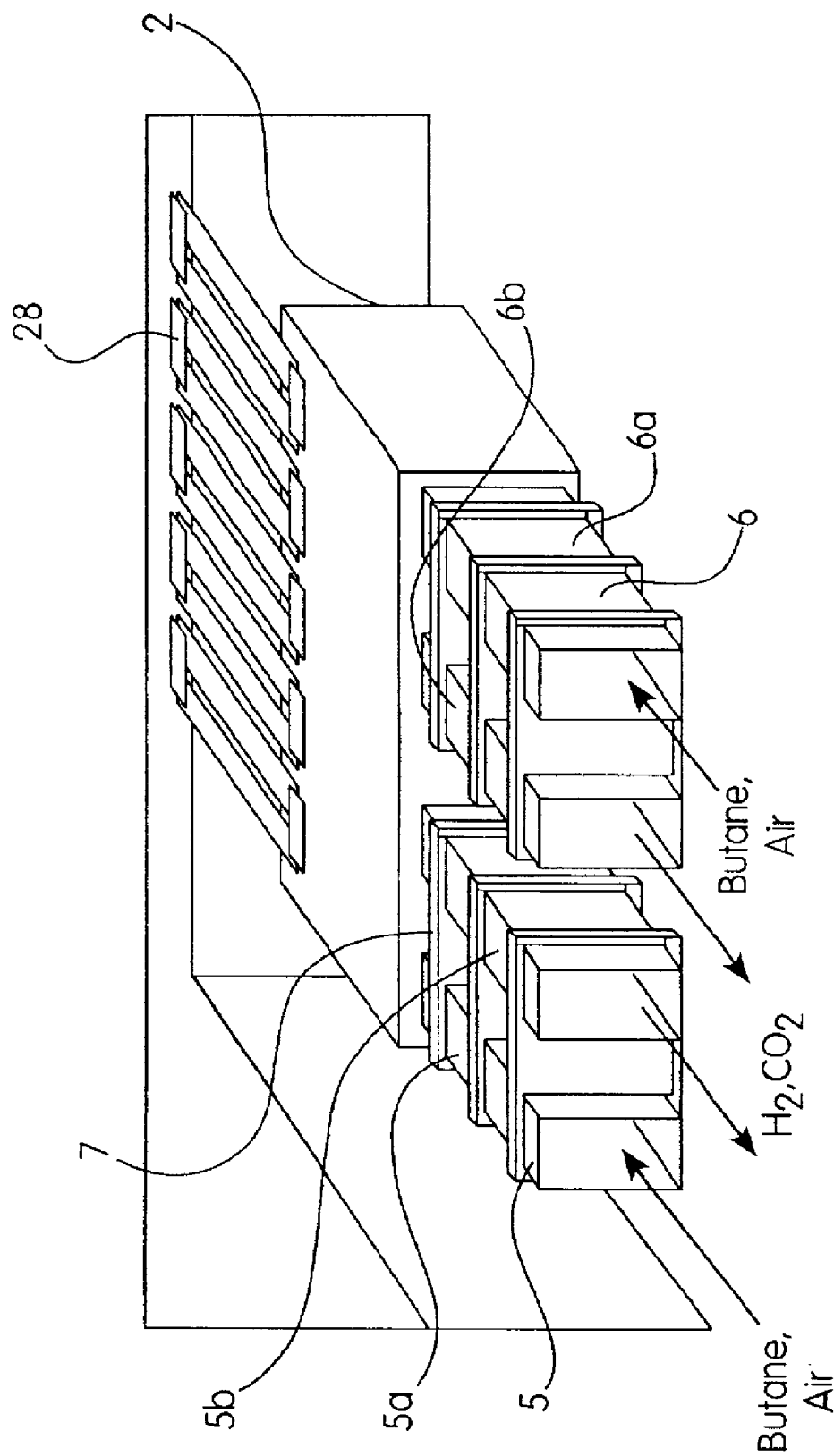
FIG. 10(d) depicts a process of thermoelectric generation that may be carried out in a micromachined device constructed according to the present invention.

As shown in FIG. 10(d), another approach to produce electricity using the described device in a portable power application is to carry out the exothermic combustion of air and butane in the device. It is noted that the embodiment depicted in FIG. 10(d) uses thermoelectric elements 28. A mixture of butane and air undergoes combustion, forming water and carbon dioxide.

EXAMPLE 7

A key feature of the micromachined device of the present invention is its ability to thermally insulate a high-temperature reaction from its environment. The reactor/heat exchanger of the present invention, as illustrated by the thermally conductive region and thermally communicating tube design of FIGS. 10(a)–(d), when properly packaged under vacuum, will only dissipate a small fraction of its heat to the environment. To test the importance of vacuum packaging and to identify the level of vacuum needed, a series of tests were performed in which known voltages were applied across a resistive heater to heat the thermally conductive region at various ambient pressures. The device used is shown in FIG. 13(a). Because current was measured along the heater, heater resistance could be calculated, and the temperature could be deduced as the resistance is a function of the temperature of the reactor. These tests provide insight on the heat transfer characteristics of the reactor/heat exchanger, as illustrated in FIGS. 10(a)–(d).

Figure 11:
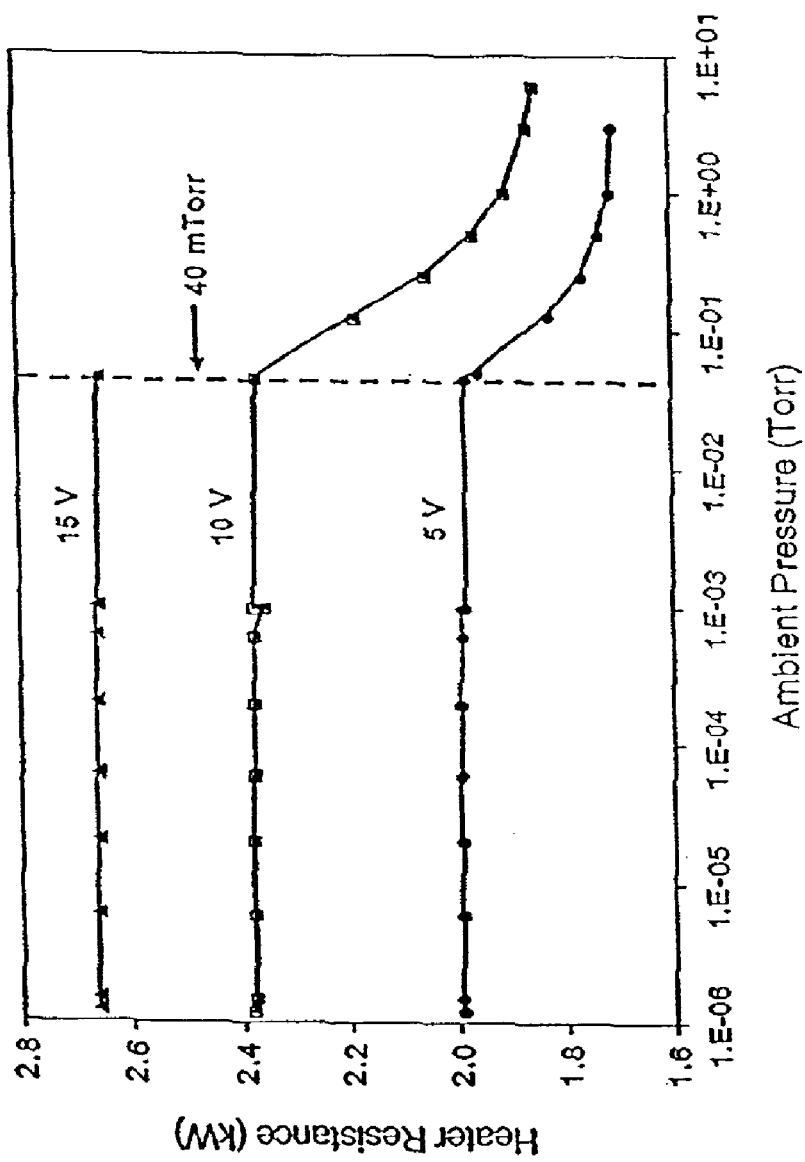
FIG. 11 is a graph depicting the resistance in a micromachined device resistive heater as a function of the ambient pressure for three varying applied voltages.

FIG. 11 summarizes the results of the tests. Below approximately 40 mTorr, ambient pressure has little effect on the temperature of the reactor and, consequently, on the steady-state heat loss of the system. Above approximately 40 mTorr, however, increased ambient pressure results in increased heat loss to the air. FIG. 11 thus verifies the important role that vacuum packaging plays in the present invention.

EXAMPLE 8

Figure 12B:
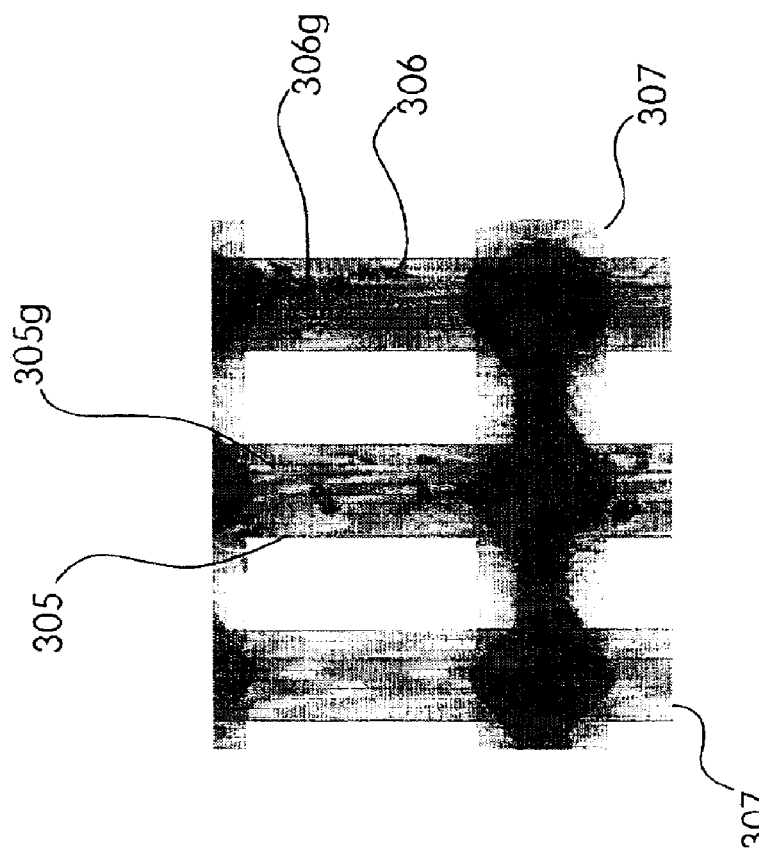
FIG. 12(b) is a transmission optical micrograph taken at approximately 50× magnification of iridium catalyst impregnated in fluid conducting tubes in an embodiment of a micromachined device constructed according to the present invention.
Figure 12A:
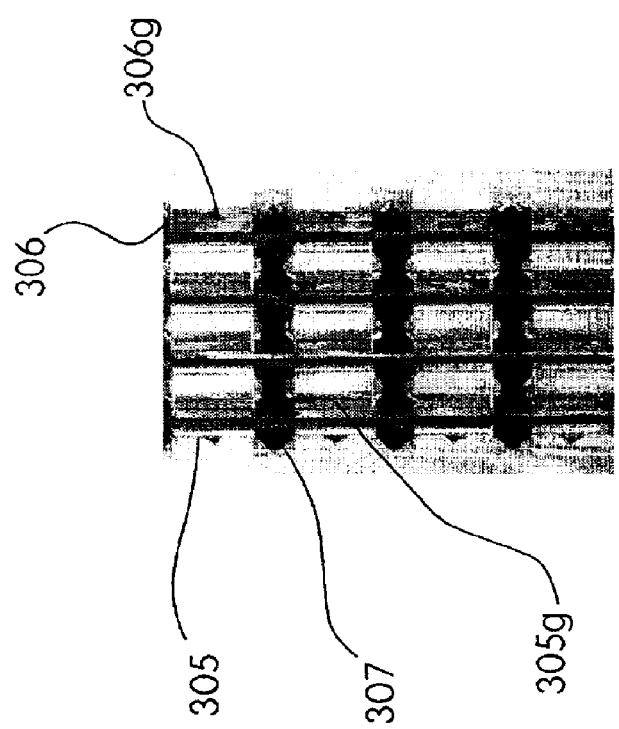
FIG. 12(a) is a reflection optical micrograph taken at approximately 20× magnification of iridium catalyst impregnated in fluid conducting tubes in an embodiment of a micromachined device constructed according to the present invention.

FIG. 12(a) and FIG. 12(b) show fluid conducting tubes 305 and 306 with iridium catalyst deposited on the inside walls 305g and 306g. Catalyst deposition techniques set forth above were employed. Thermally conductive structures 307 are also shown in these figures. These pictures confirm that catalyst is effectively being deposited internal to the tubes.

Figure 12C:
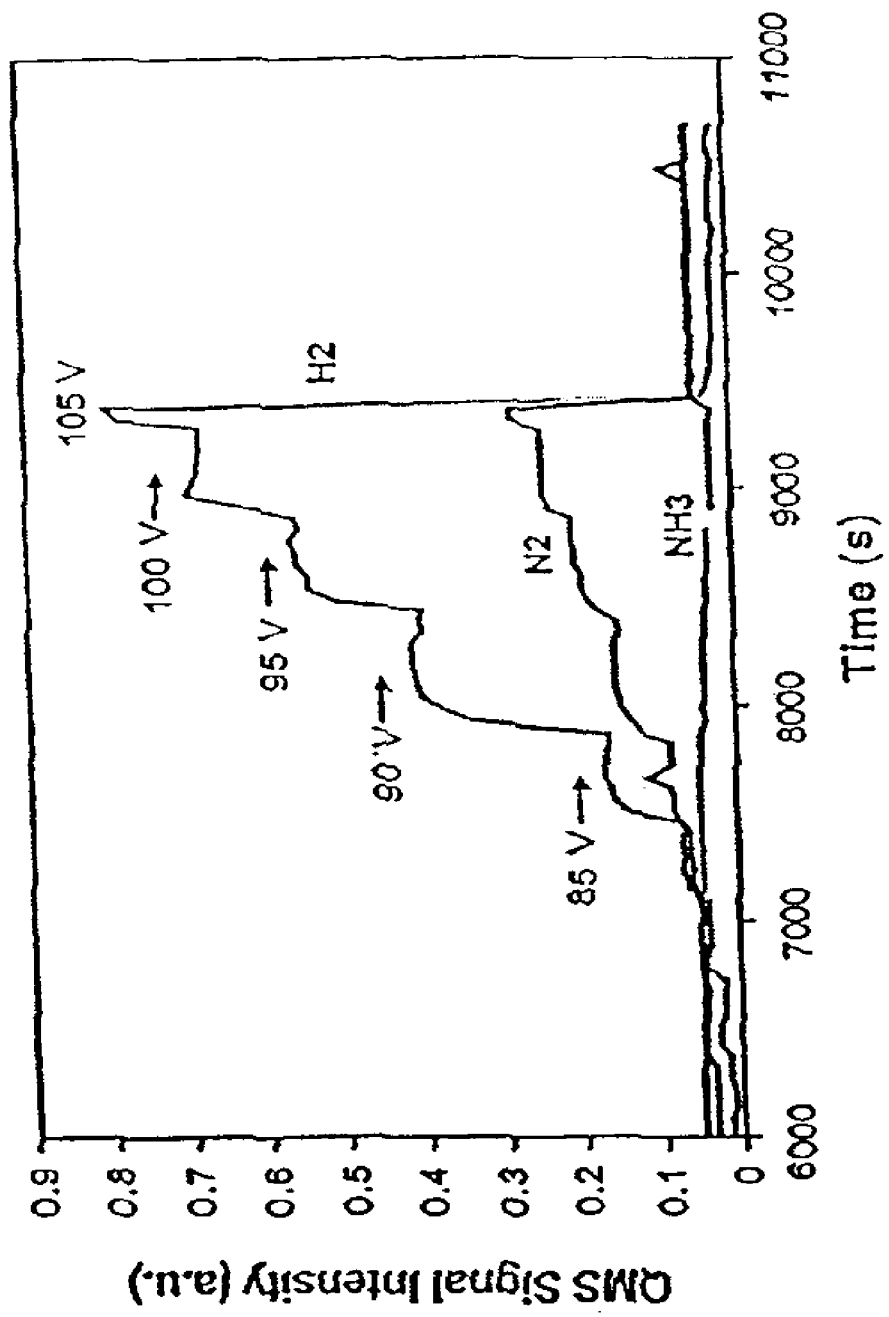
FIG. 12(c) is a graph of quadropole mass spectrometer (QMS) signal intensity over time for ammonia cracking over iridium catalyst at an ammonia flow rate of 4 standard cubic centimeters per minute (sccm) in the thermally conductive region of a micromachined device constructed according to the present invention.

FIG. 12(c) depicts the results of a test conducted with an ammonia flow rate of 4 sccm. In the graph, the signal from a quadropole mass spectrometer (QMS) is plotted over time for hydrogen, nitrogen, and ammonia. The voltage across the integrated heater was increased periodically to increase the reaction temperature. The graph shows that the conversion of ammonia (represented by the $NH_3$ curve) to hydrogen and nitrogen (represented by the $H_2$ and $N_2$ curves respectively) increases as the voltage across the heater is increased (corresponding to an increase in temperature). At the highest voltage setting, conversion of the ammonia is approximately 35%. This translates into approximately 2 sccm of $H_2$ produced. The estimated temperature at the highest voltage is approximately 1832° F. (1000° C.).

EXAMPLE 9

Figure 13B:
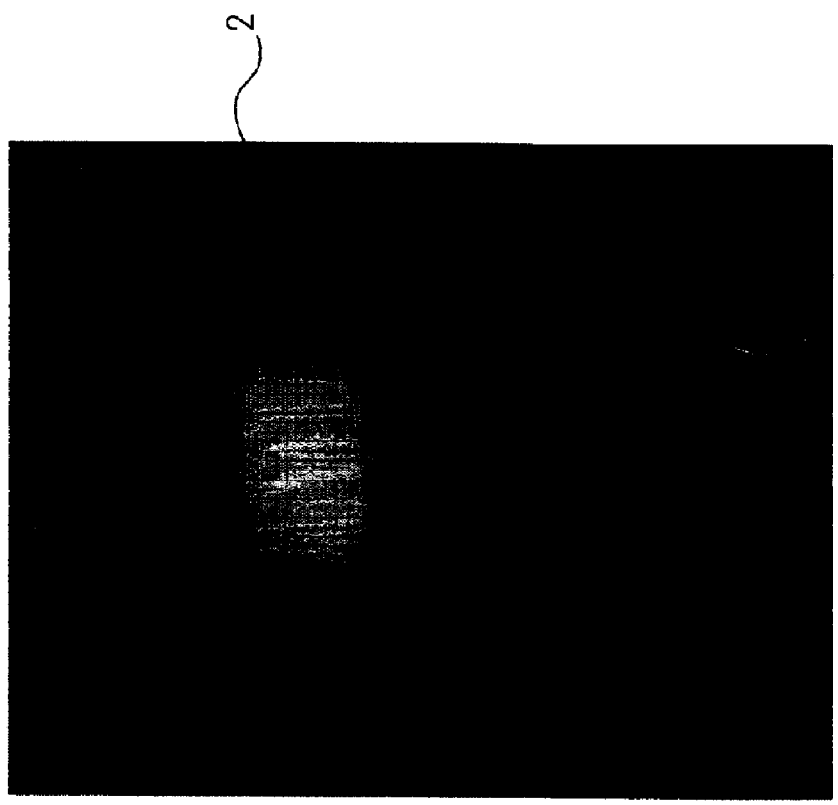
FIG. 13(b) is an image of the embodiment of FIG. 13(a) wherein the thermally conductive region is heated to a temperature of about 1832° F. (1000° C.).
Figure 13A:
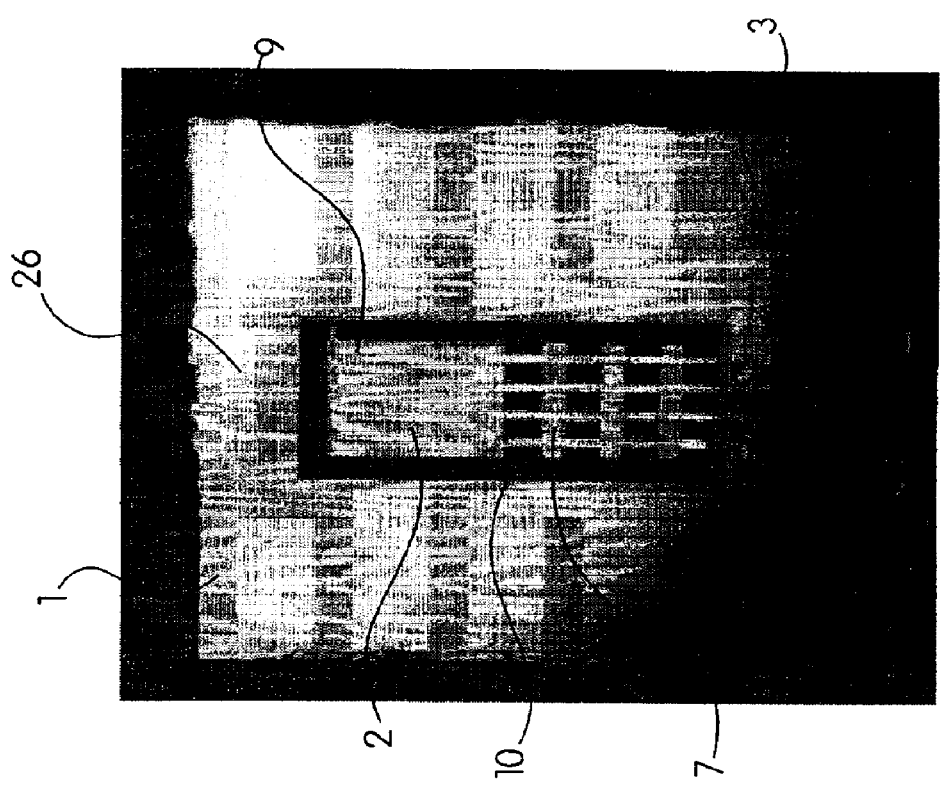
FIG. 13(a) is a photograph of a micromachined device adapted for processing a fluid and constructed according to the present invention.

FIGS. 13(a) and 13(b) provide images of a micromachined device 1. FIG. 13(a) provides an image of the fully fabricated device 1 at room temperature. The suspended thermally conductive region 2 is free standing and the tubes 5 and 6 are U-shaped to minimize stresses during thermal expansion. FIG. 13(b) shows the device with the thermally conductive region 2 heated to about 1832° F. (1000° C.) using the resistive heater trace 9, which is also used as a temperature sensor for the temperature of the thermally conductive region 2. The amount of power required to bring the thermally conductive region 2 to 1832° F. (1000° C.) in an air ambient is 1.4 W. This test was performed to determine the behavior of the device 1 when subjected to a substantial thermal gradient. Significantly, only the thermally conductive region 2 is glowing, with the adjacent fluid conducting tubes 5 and 6 being substantially cooler. The surrounding substrate 3 remains essentially at room temperature, as confirmed by measurements of a reference temperature sensor 26 placed on the substrate 3. These results demonstrate that the thermally conductive region 2 achieves the high thermal isolation required for fuel processing and the substrate thermal gradient that is required for co-location of sensing, computing, actuation, and power generation in a single micromachined device.

It is to be understood that the present description illustrates certain aspects of the invention relevant to a clear understanding of the invention. Certain aspects of the invention that would be apparent to those of ordinary skill in the art and that, therefore, would not facilitate a better understanding of the invention have not been presented in order to simplify the present description. Also, although the present invention has been described in connection with certain embodiments, those of ordinary skill in the art will, upon considering the foregoing description, recognize that many modifications and variations of the invention may be employed. It is intended that all such variations and modifications of the invention are covered by the foregoing description and the following claims.

What is claimed is:

1. A micromachined device for thermal processing at least one fluid stream, the micromachined device comprising at least one fluid conducting tube, wherein at least a region of the fluid conducting tube has a wall thickness of less than 50 µm, the micromachined device further comprising a thermoelectric device.

2. The micromachined device of claim 1, wherein a catalyst is disposed within the fluid conducting tube.

3. A micromachined device for thermal processing at least one fluid stream, the micromachined device comprising at least one fluid conducting tube, wherein at least a region of the fluid conducting tube has a wall thickness of less than 50 µm, and wherein the micromachined device is a component of a thermophotovoltaic device.

4. The micromachined device of claim 3, wherein a catalyst is disposed within the fluid conducting tube.

5. A micromachined device for thermal processing at least one fluid stream, the micromachined device comprising at least one fluid conducting tube, wherein at least a region of the fluid conducting tube has a wall thickness of less than 50 µm, and wherein the micromachined device is a component of a portable power generator.

6. The micromachined device of claim 5, wherein the fluid conducting tube includes an inlet portion, an outlet portion and an intermediate portion intermediate the inlet portion and the outlet portion.

7. The micromachined device of claim 5, wherein the fluid conducting tube comprises silicon nitride.

8. The micromachined device of claim 5, wherein at least a region of the fluid conducting tube has a wall thickness less than 5 µm.

9. The micromachined device of claim 5, wherein at least a region of the fluid conducting tube has a wall thickness of 0.1 to 3 µm.

10. The micromachined device of claim 5, wherein the micromachined device includes at least one inlet portion for introducing a fluid into the fluid conducting tube.

11. The micromachined device of claim 5, wherein the fluid conducting tube has a stress-relieving shape.

12. The micromachined device of claim 5, wherein the fluid conducting tube is generally U-shaped.

13. The micromachined device of claim 5, wherein at least one post is disposed within the fluid conducting tube.

14. The micromachined device of claim 13, wherein the at least one post comprises a catalyst.

15. The micromachined device of claim 5, wherein at least one static fluidic mixing structure is disposed within the fluid conducting tube.

16. The micromachined device of claim 5, wherein at least one passive fluidic stop valve is disposed within the fluid conducting tube.

17. The micromachined device of claim 6, further comprising a substrate, and wherein one or more regions of the inlet and outlet portions of the fluid conducting tube are disposed in the substrate.

18. The micromachined device of claim 5, wherein a catalyst is disposed within the fluid conducting tube.

19. The micromachined device of claim 6, wherein a catalyst is disposed within the intermediate portion of the fluid conducting tube.

20. The micromachined device of claim 5, further comprising a sensor.

21. The micromachined device of claim 5, futher comprising an actuator.

22. The micromachined device of claim 5, further comprising a substrate defining a sealed cavity, wherein substantial portions of the fluid conducting tube are mounted within the sealed cavity.

23. The micromachined device of claim 5, wherein the fluid conducting tubecomprises at least one junction where one tube is connected to at least two tubes.

24. A micromachined device for processing at least one fluid stream, the micromachined device comprising:
    at least one fluid conducting tube; and
    at least one thermally conductive structure in thermal communication with a first thermally insulating portion of the fluid conducting tube and a second thermally insulating portion of the fluid conducting tube.

25. The micromachined device of claim 24, wherein the first thermally insulating portion of the fluid conducting tube is an inlet portion and the second thermally insulating portion of the fluid conducting tube is an outlet portion.

26. The micromachined device of claim 24, wherein the thermally conductive structure comprises silicon.

27. The micromachined device of claim 24, wherein at least a region of the fluid conducting tube has a wall thickness of less than 50 µm.

28. The micromachined device of claim 24, wherein at least a region of the fluid conducting tube has a wall thickness of less than 5 µm.

29. The micromachined device of claim 24, wherein at least a region of the fluid conducting tube has a wall thickness of 01–3 µm.

30. The micromachined device of claim 24, wherein at least one post is disposed within the fluid conducting tube.

31. The micromachined device of claim 24, wherein the fluid conducting tube has a stress-relieving shape.

32. The micromachined device of claim 24, wherein a catalyst is disposed within the fluid conducting tube.

33. The micromachined device of claim 25, further comprising a substrate defining a sealed cavity, at least a region of the inlet portion and at least a region of the outlet portion disposed in the substrate, and wherein substantial portions of the fluid conducting tube are mounted within the sealed cavity.

34. A micromachined device for processing at least two fluid streams, the micromachined device comprising:
    a first fluid conducting tube;
    a second fluid conducting tube; and
    at least one thermally conductive structure in thermal communication with a thermally insulating portion of the first fluid conducting tube and a thermally insulating portion of the second fluid conducting tube.

35. The micromachined device of claim 34, wherein at least a region of at least one of the first fluid conducting tube and the second fluid conducting tube has a wall thickness of less than 50 µm.

36. The micromachined device of claim 34, wherein at least a region of at least one of the first fluid conducting tube and the second fluid conducting tube has a wall thickness of less than 5 µm.

37. The micromachined device of claim 34, wherein at least a region of at least one of the first fluid conducting tube and the second fluid conducting tube has a wall thickness of 0.1–3 µm.

38. A micromachined device for processing at least one fluid stream, the micromachined device comprising:
    a thermally conductive region; and
    at least one fluid conducting tube with at least one thermally insulating portion, at least a portion of the fluid conducting tube disposed within the thermally conductive region.

39. The micromachined device of claim 38, wherein at east one post is disposed within the portion of the fluid conducting tube disposed within the thermally conductive region.

40. The micromachined device of claim 39, wherein the posts are thermally conductive.

41. The micromachined device of claim 38, wherein the thermally conductive region is substantially isothermal during operation of the micromachined device.

42. The micromachined device of claim 38, wherein the thermally conductive region comprises silicon.

43. The micromachined device of claim 38, wherein the portion of the fluid conducting tube disposed within the thermally conductive region is encased within the thermally conductive region.

44. The micromachined device of claim 38, wherein at least a region of at least one of the first fluid conducting tube and the second fluid conducting tube has a wall thickness of less than 50 $\mu$m.

45. The micromachined device of claim 38, wherein at least a region of at least one of first fluid conducting tube and the second fluid conducting tube has a wall thickness of less than 5 $\mu$m.

46. The micromachined device of claim 38, wherein at least a region of at least one of the first fluid conducting tube and the second fluid conducting tube has a well thickness of 0.1–3 $\mu$m.

47. The micromachined device of claim 38, wherein at least one post is disposed within at least one fluid conducting tube.

48. A method for processing at least one fluid stream, the method comprising:
providing a micromachined device including at least one fluid conducting tube having a thermally insulating inlet portion, and a thermally insulating outlet portion, and at least one thermally conductive structure in thermal communication with the inlet portion and the outlet portion;
introducing a stream of at least one fluid into the inlet portion of the fluid conducting tube;
processing the fluid stream within the fluid conducting tube; and
conducting thermal energy between the inlet portion and the outlet portion through the thermally conductive structure.

49. The method of claim 48, wherein the micromachined device further comprises a thermally conductive region, at least a portion of the fluid conducting tube disposed within the thermally conductive region.

50. The method of claim 48, wherein at least one fluid reacts within the fluid conducting tube to produce at least two fluid reaction products, the fluid comprising ammonia and the fluid reaction products comprising hydrogen and nitrogen.

51. The method of claim 48, wherein at least two fluids react within the fluid conducting tube to produce at least two fluid reaction products, the fluids comprising methanol and water and the fluid reaction products comprising carbon dioxide and hydrogen.

52. The method of claim 48, wherein at least two fluids react within the fluid conducting tube to produce at least two fluid reaction products, the fluids comprising air and butane and the fluid reaction products comprising water and carbon dioxide.

53. The method of claim 48, wherein at least two fluids react within the fluid conducting tube to produce at least two fluid reaction products, the fluids comprising air and butane and the fluid reaction products comprising hydrogen and carbon monoxide.

54. The method of claim 49, further comprising:
providing a second fluid conducting tube having an inlet portion, and an outlet portion, at least a portion of the fluid conducting tube disposed within the thermally conductive region;
directing at least a portion of the fluid reaction products from the outlet portion of the fluid conducting tube to a fuel cell;
directing at least a portion of fluids exiting the fuel cell to the inlet portion of the second fluid conducting tube; and
reacting the portion of the fluids exiting the fuel cell within the second fluid conducting tube to produce thermal energy and heat the thermally conductive region.

55. The method of claim 48, further comprising providing a catalyst within at least a region of the fluid conducting tubes.

56. A portable power generator comprising:
a micromachined device including
at least one fluid conducting tube, and
at least one thermally conductive structure in thermal communication with a first thermally insulating portion of the fluid conducting tube and a second thermally insulating portion of the fluid conducting tube; and
a fuel cell in fluid communication with the fluid conducting tube.

57. A method for generating power comprising:
providing a micromachined device including
at least one fluid conducting tube, and
at least one thermally conductive structure in thermal communication with a first thermally insulating portion of the fluid conducting tube and a second thermally insulating portion of the fluid conducting tube;
providing a fuel cell in fluid communication with the fluid conducting tube;
producing a fuel within the fluid conducting tube; and
conveying the fuel to the fuel cell.

58. The method of claim 57, wherein the fuel comprises hydrogen.

59. The method of claim 57, wherein producing a fuel comprises reacting a stream of at least one fluid within the fluid conducting tube to produce at least two fluid reaction products, the fluid comprising ammonia and the fluid reaction products comprising hydrogen and nitrogen.

60. The method of claim 57, wherein producing a fuel comprises reacting a stream of at least two fluids within the fluid conducting tube to produce at least two fluid reaction products, the fluids comprising methanol and water and the fluid reaction products comprising carbon dioxide and hydrogen.

61. The method of claim 57, wherein producing a fuel comprises reacting a stream of at least two fluids within the fluid conducting tube to produce at least two fluid reaction products, the fluids comprising air and butane and the fluid reaction products comprising hydrogen and carbon monoxide.

62. The micromachined device of claim 30, wherein the at least one post are is thermally conductive.

63. The method of claim 57, wherein the fuel comprises hydrogen and carbon monoxide.

* * * * *

UNITED STATES PATENT AND TRADEMARK OFFICE
CERTIFICATE OF CORRECTION

| | |
|---|---|
| PATENT NO. | : 6,939,632 B2 |
| APPLICATION NO. | : 09/923139 |
| DATED | : September 6, 2005 |
| INVENTOR(S) | : Arana et al. |

It is certified that error appears in the above-identified patent and that said Letters Patent is hereby corrected as shown below:

Description of Invention

Column 2, Ln. 44: delete "in a increased" and substitute therefor --in an increased--

Column 2, Ln. 49: delete "as well measurement of" and substitute therefor --as well as measurement of--

Signed and Sealed this

Nineteenth Day of December, 2006

JON W. DUDAS
*Director of the United States Patent and Trademark Office*